(12) United States Patent
Shao et al.

(10) Patent No.: US 9,369,759 B2
(45) Date of Patent: Jun. 14, 2016

(54) METHOD AND SYSTEM FOR PROGRESSIVE RATE ADAPTATION FOR UNCOMPRESSED VIDEO COMMUNICATION IN WIRELESS SYSTEMS

(75) Inventors: Huai-Rong Shao, Santa Clara, CA (US); Ju-Lan Hsu, Saratoga, CA (US); Chiu Ngo, San Francisco, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 800 days.

(21) Appl. No.: 12/754,522

(22) Filed: Apr. 5, 2010

(65) Prior Publication Data

US 2010/0265392 A1    Oct. 21, 2010

Related U.S. Application Data

(60) Provisional application No. 61/169,647, filed on Apr. 15, 2009.

(51) Int. Cl.
*H04N 7/50* (2006.01)
*H04N 21/4363* (2011.01)
*H04N 7/01* (2006.01)
(Continued)

(52) U.S. Cl.
CPC ....... *H04N 21/43637* (2013.01); *H03M 7/3044* (2013.01); *H04N 7/012* (2013.01); *H04N 7/125* (2013.01); *H04N 11/046* (2013.01); *H04N 19/428* (2014.11); *H04N 21/4126* (2013.01)

(58) Field of Classification Search
CPC .............. H04N 21/4126; H04N 21/43637; H04N 7/012; H04N 7/125
USPC ..................................................... 375/240.26
See application file for complete search history.

(56) References Cited

U.S. PATENT DOCUMENTS

| | | | |
|---|---|---|---|
| 4,661,862 A | 4/1987 | Thompson | |
| 5,189,510 A | 2/1993 | Henaff et al. | |

(Continued)

FOREIGN PATENT DOCUMENTS

| | | | |
|---|---|---|---|
| CN | 1402852 A | 3/2003 | |
| CN | 1708754 A | 12/2005 | |

(Continued)

OTHER PUBLICATIONS

International Search Report and Written Opinion mailed 6 Dec. 2010 in PCT/KR2010/002192, 6 pp., Korean Intellectual Property Office, Republic of Korea.

(Continued)

*Primary Examiner* — Tung Vo
(74) *Attorney, Agent, or Firm* — Sherman IP LLP; Kenneth L. Sherman; Steven Laut

(57) ABSTRACT

Uncompressed video information is transmitted over a wireless communication medium from a wireless sender device to a wireless receiver device. Progressive transmission data rate adaptation is performed on original uncompressed video pixel information. The progressive transmission data rate adaptation is performed on selected pixel information to obtain a rate-reduced pixel information. The rate-reduced pixel information requires a lower transmission data rate than the original frame. The rate-reduced pixel information is transmitted over the wireless communication medium to the wireless receiver device. At the receiver, a reverse operation is performed to recover the original uncompressed video pixel information.

47 Claims, 24 Drawing Sheets

(51) Int. Cl.
*H04N 7/12* (2006.01)
*H04N 21/41* (2011.01)
*H03M 7/30* (2006.01)
*H04N 11/04* (2006.01)
*H04N 19/426* (2014.01)

(56) References Cited

U.S. PATENT DOCUMENTS

| | | | |
|---|---|---|---|
| 5,289,190 A | 2/1994 | Shimoda et al. | |
| 5,453,840 A | 9/1995 | Parker et al. | |
| 5,768,535 A | 6/1998 | Chaddha et al. | |
| 5,936,669 A | 8/1999 | Niesen | |
| 5,969,764 A | 10/1999 | Sun et al. | |
| 6,052,159 A | 4/2000 | Ishii et al. | |
| 6,088,045 A | 7/2000 | Lumelsky et al. | |
| 6,094,453 A | 7/2000 | Gosselin et al. | |
| 6,115,420 A | 9/2000 | Wang | |
| 6,201,834 B1 | 3/2001 | Zhu | |
| 6,239,886 B1 | 5/2001 | Klassen et al. | |
| 6,298,085 B1 | 10/2001 | Kondo et al. | |
| 6,418,240 B1 | 7/2002 | Yu | |
| 6,512,218 B1 | 1/2003 | Canini et al. | |
| 6,571,016 B1 | 5/2003 | Mehrotra et al. | |
| 6,757,435 B2 | 6/2004 | Kondo | |
| 6,868,186 B1 | 3/2005 | Sadeh | |
| 6,925,119 B2 | 8/2005 | Bartolucci et al. | |
| 6,973,221 B1 | 12/2005 | Xue | |
| 7,015,961 B2 | 3/2006 | Kakarala | |
| 7,027,515 B2 | 4/2006 | Lin | |
| 7,075,993 B2 | 7/2006 | O'Brien, Jr. | |
| 7,082,166 B2 | 7/2006 | Prakash et al. | |
| 7,099,678 B2 | 8/2006 | Vaidyanathan | |
| 7,103,669 B2 | 9/2006 | Apostolopoulos | |
| 7,113,556 B1 | 9/2006 | Heegard et al. | |
| 7,227,900 B2 | 6/2007 | Porter et al. | |
| 7,283,165 B2 | 10/2007 | Alderson et al. | |
| 7,339,993 B1 | 3/2008 | Brooks et al. | |
| 7,627,348 B2 | 12/2009 | Lysejko et al. | |
| 7,630,442 B2 | 12/2009 | Sekiguchi et al. | |
| 7,643,558 B2 | 1/2010 | Garudadri et al. | |
| 7,734,106 B1 | 6/2010 | Zhang et al. | |
| 7,876,968 B2* | 1/2011 | Chang | H04N 19/119 382/245 |
| 7,991,055 B2 | 8/2011 | Cancemi et al. | |
| 8,098,741 B2 | 1/2012 | Suh et al. | |
| 2003/0035586 A1* | 2/2003 | Chou | H04N 19/61 382/233 |
| 2005/0047504 A1* | 3/2005 | Sung | H04N 19/105 375/240.2 |
| 2006/0013299 A1* | 1/2006 | Sato | H04N 19/159 375/240.03 |
| 2006/0013320 A1 | 1/2006 | Oguz et al. | |
| 2006/0146940 A1 | 7/2006 | Gomila et al. | |
| 2006/0239360 A1 | 10/2006 | Kadono et al. | |
| 2006/0268760 A1 | 11/2006 | Fang et al. | |
| 2007/0014360 A1 | 1/2007 | Botzko et al. | |
| 2007/0091999 A1 | 4/2007 | Nissan-Cohen et al. | |
| 2007/0098063 A1 | 5/2007 | Reznic et al. | |
| 2007/0171975 A1* | 7/2007 | Smith | H04N 19/159 375/240.13 |
| 2007/0189383 A1 | 8/2007 | Shao et al. | |
| 2007/0202842 A1* | 8/2007 | Shao | H04N 19/89 455/403 |
| 2007/0274382 A1* | 11/2007 | Hickey | H03M 7/40 375/240.03 |
| 2007/0296822 A1* | 12/2007 | Lan | H04N 21/4126 348/211.99 |
| 2008/0101467 A1 | 5/2008 | MacMullan et al. | |
| 2008/0107330 A1 | 5/2008 | Cotman et al. | |
| 2008/0144553 A1 | 6/2008 | Shao et al. | |
| 2008/0232478 A1 | 9/2008 | Teng et al. | |
| 2008/0267299 A1 | 10/2008 | Hannuksela et al. | |
| 2008/0285651 A1 | 11/2008 | Au et al. | |
| 2009/0021646 A1 | 1/2009 | Shao et al. | |
| 2009/0063935 A1 | 3/2009 | Singh et al. | |
| 2009/0232206 A1* | 9/2009 | Boon | H04N 19/00569 375/240.12 |
| 2010/0014584 A1* | 1/2010 | Feder | H04N 19/176 375/240.12 |
| 2010/0150463 A1* | 6/2010 | Yeung | H04N 19/147 382/239 |
| 2010/0166057 A1* | 7/2010 | Huchet | H04N 19/46 375/240.01 |
| 2011/0109792 A1* | 5/2011 | Montag | H04L 65/602 348/390.1 |

FOREIGN PATENT DOCUMENTS

| | | |
|---|---|---|
| CN | 1905679 A | 1/2007 |
| JP | 2002-032295 | 1/2002 |
| JP | 2006-526367 A | 11/2006 |
| JP | 2008-219479 | 9/2008 |
| KR | 10-2008-0095833 | 10/2008 |
| KR | 10-2009-0100219 A | 9/2009 |
| WO | 2004073201 | 8/2004 |
| WO | 2008030032 A2 | 3/2008 |
| WO | 2008060025 A1 | 5/2008 |

OTHER PUBLICATIONS

U.S. Notice of Allowance for U.S. Appl. No. 11/897,087 mailed Jan. 20, 2012.
U.S. Non-Final Office Action for U.S. Appl. No. 11/598,920 mailed Apr. 3, 2012.
U.S. Notice of Allowance for U.S. Appl. No. 11/897,087 mailed Apr. 25, 2012.
Schwarz, H. et al., "Overview of the Scalable Video Coding Extension of the H.264/AVC Standard", IEEE Transactions on Circuits and Systems for Video Technology, vol. 17, No. 9, Sep. 2007, pp. 1-18, United States.
Hitachi, Ltd. et al., "High-Definition Multimedia Interface Specification Version 1.2," Aug. 22, 2005, pp. 1-214, United States.
International Search Report dated Oct. 12, 2007 for International Application No. PCT/KR2007/003251 from Korean Intellectual Property Office, filed Jul. 4, 2007, 2 pages.
International Search Report and Written Opinion dated Oct. 12, 2007 for International Application No. PCT/KR2007/003251 from Korean International Property Office, filed Jul. 4, 2007, 10 pages, Seo-gu, Daejeon, Republic of Korea.
U.S. Non-Final Office Action for U.S. Appl. No. 11/598,920 mailed May 6, 2011.
U.S. Final Office Action for U.S. Appl. No. 11/598,920 mailed Jul. 25, 2012.
U.S. Non-Final Office Action for U.S. Appl. No. 12/048,126 mailed Oct. 22, 2012.
U.S. Non-Final Office Action for U.S. Appl. No. 11/598,920 mailed Mar. 13, 2013.
U.S. Final Office Action for U.S. Appl. No. 12/048,126 mailed Mar. 20, 2013.
U.S. Notice of Allowance for U.S. Appl. No. 11/598,920 mailed Aug. 15, 2013.
U.S. Non-Final Office Action for U.S. Appl. No. 12/048,126 mailed Aug. 21, 2013.
U.S. Notice of Allowance for U.S. Appl. No. 12/048,126 mailed May 23, 2014.
U.S. Supplemental Notice of Allowability for U.S. Appl. No. 12/048,126 mailed Jul. 8, 2014.
Chinese Office Action dated Dec. 26, 2013 for Chinese Patent Application No. 201080017149.0, pp. 1-14, China Intellectual Property Office, Beijing City, China (A machine-generated English translation, pp. 1-7).
Japanese Office Action dated Feb. 18, 2014 for Japanese Patent Application No. 2012-505807, pp. 1-4, Japan Patent Office, Tokyo, Japan (A machine-generated English translation, pp. 1-2).
U.S. Final Office Action for U.S. Appl. No. 12/048,126 mailed Feb. 12, 2014.
U.S. Advisory Action for U.S. Appl. No. 12/048,126 mailed Apr. 17, 2014.

(56) References Cited

OTHER PUBLICATIONS

Chinese Office Action dated Oct. 14, 2014 for Chinese Patent Application No. 201080017149.0, pp. 1-12, China Intellectual Property Office, Beijing City, China (An English-language translation attached, pp. 6-12).

Korean Office Action dated Nov. 11, 2009 for Korean Patent Application No. 10-2008-7006604, pp. 1-3, Korean Intellectual Property Office, Seo-gu, Daejeon, Republic of Korea (Machine-generated English translation attached, pp. 1-2).

Korean Final Office Action dated Feb. 18, 2010 for Korean Patent Application No. 10-2008-7006604, pp. 1-2, Korean Intellectual Property Office, Seo-gu, Daejeon, Republic of Korea (Machine-generated English translation attached, p. 1).

U.S. Final Office Action for U.S. Appl. No. 11/598,920 mailed Oct. 19, 2011.

U.S. Non-Final Office Action for U.S. Appl. No. 12/048,126 mailed Dec. 28, 2011.

WirelessHD LLC, "WirelessHD Specification, Revision 0.9.1d1," Jun. 13, 2007, pp. i-443, United States.

Extended European Search Report dated Feb. 8, 2016 for European Application No. 10764607.7 from European Patent Office, pp. 1-10, Munich, Germany.

Kim, W-Y. et al., "Hierarchy Embedded Differential Image for Progressive Transmission Using Lossless Compression", Proceedings of the IEEE Transactions on Circuits and Systems for Video Technology, Feb. 1, 1995, pp. 1-13, vol. 5, No. 1, IEEE, United States.

Yamada, a. et al., "Pyramdial Tat Scheme for Image Data Compression", Proceedings of the Transactions of the Institute of Electronics, Information and Communication Engineers, Oct. 1, 1990, pp. 1632-1639, vol. E73, No. 10, Tokyo, Japan.

Korean Office Action dated Mar. 3, 2016 for Korean Application No. 10-2010-7016620 from Korean Intellectual Property Office, pp. 1-10, Daejeon, Republic of Korean (Machine-generated English-language Translation, pp. 7-10).

* cited by examiner

4x2 differential transformation mode

METHOD AND SYSTEM FOR PROGRESSIVE RATE ADAPTATION FOR UNCOMPRESSED VIDEO COMMUNICATION IN WIRELESS SYSTEMS

RELATED APPLICATION

This application claims priority from U.S. Provisional Patent Application Ser. No. 61/169,647, filed Apr. 15, 2009, incorporated herein by reference.

FIELD OF THE INVENTION

The present invention relates in general to wireless communication, and in particular, to wireless video communication.

BACKGROUND OF THE INVENTION

With the proliferation of high quality video, an increasing number of electronics devices (e.g., consumer electronics devices) utilize high-definition (HD) video. Conventionally, most devices compress the HD video, which can be around several Gbps (giga bits per second) in bandwidth, to a fraction of its size to allow for transmission between devices. However, with each compression and subsequent decompression of the video, some video information can be lost and the picture quality is degraded.

In many wireless communication systems, a frame structure is used for data transmission between wireless stations such as a transmitter and a receiver. For example, the IEEE 802.11 standard uses a frame structure in a Media Access Control (MAC) layer and a physical (PHY) layer. In a typical transmitter, a MAC layer receives a MAC Service Data Unit (MSDU) and attaches a MAC header thereto, in order to construct a MAC Protocol Data Unit (MPDU). The MAC header includes information such as a source address (SA) and a destination address (DA). The MPDU is a part of a PHY Service Data Unit (PSDU) and is transferred to a PHY layer in the transmitter to attach a PHY header (i.e., PHY preamble) thereto to construct a PHY Protocol Data Unit (PPDU). The PHY header includes parameters for determining a transmission scheme including a coding/modulation scheme. Before transmission as a packet from a transmitter to a receiver, a preamble is attached to the PPDU, wherein the preamble can include channel estimation and synchronization information.

In such wireless communication systems, before a video stream is transmitted, connection setup and channel bandwidth reservation are conducted. Ideally, sufficient channel bandwidth can be allocated and the video stream can be transmitted smoothly after stream set up control. However, the stream may not receive sufficient channel bandwidth due to other ongoing transmissions on the same channel. In addition, usually the quality of wireless channel is dynamically changed from time to time. Particularly, for 60 GHz wireless channels with beamformed transmissions, the channel can be affected even by human being movement. When the quality of a wireless channel is degraded, usually the MAC/PHY layer automatically changes the modulation and coding scheme (MCS) to a lower level to keep the same BER (bit error rate) performance. The total data throughput is decreased with a lower MCS level. The originally reserved bandwidth for a video stream cannot accommodate the video data due to MCS mode switching to a lower mode.

BRIEF SUMMARY OF THE INVENTION

Embodiments of the invention provide progressive rate adaptation for uncompressed video communication in wireless systems. One embodiment comprises a wireless communication system implementing a process for transmitting video information over a wireless communication medium from a wireless sender device by obtaining an original uncompressed video pixel information and performing progressive transmission data rate adaptation. The progressive transmission data rate adaptation is performed on selected pixel information to obtain rate-reduced video pixel information. The rate-reduced video pixel information requires a lower transmission data rate than the original video pixel information. The rate-reduced video pixel information is transmitted over the wireless communication medium to a wireless receiver device for recovery to reconstruct the uncompressed video pixel information at the receiver device.

These and other features, aspects and advantages of the present invention will become understood with reference to the following description, appended claims and accompanying figures.

DESCRIPTION OF THE INVENTION

Figure 1:
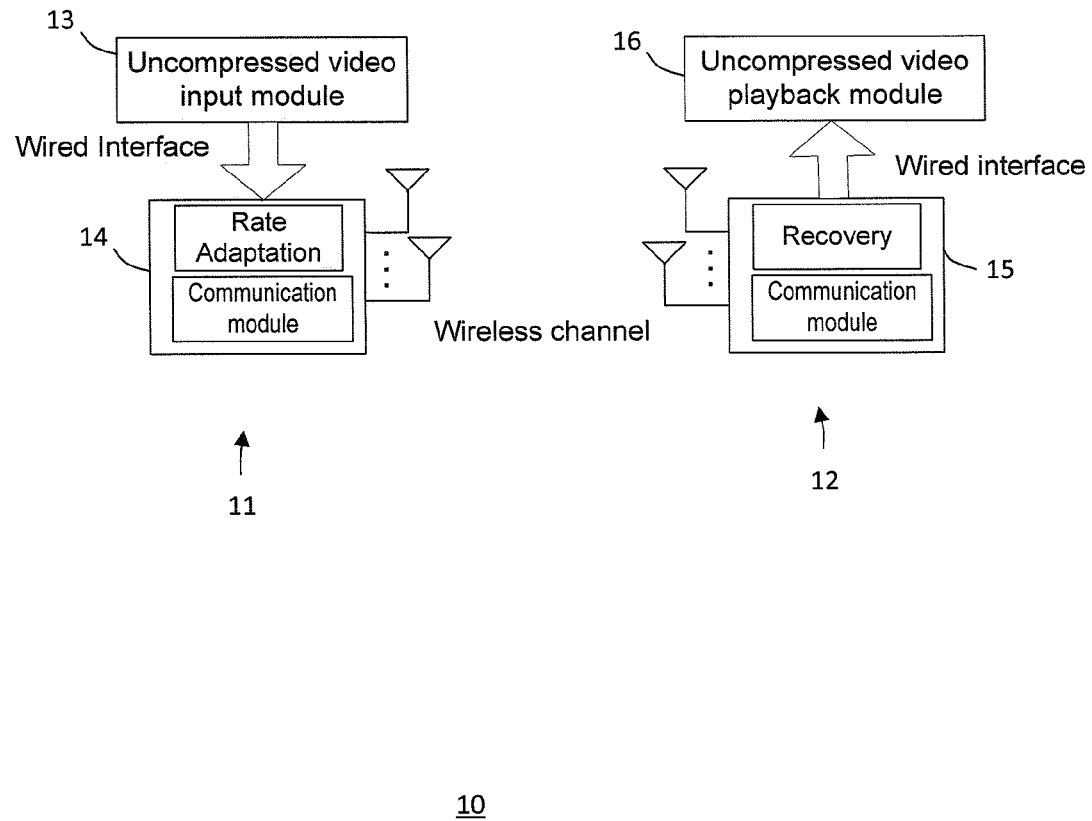
FIG. 1 shows a block diagram of a progressive rate adaptive communication system for uncompressed video transmission over a wireless communication medium, according to an embodiment of the invention.

The invention provides a method and system for progressive transmission data rate adaptation for uncompressed video communication in wireless systems. The video comprises pixels of video information. One embodiment comprises a communication system implementing a communication process, wherein transmission data rate of a video stream is dynamically adapted to the available communication bandwidth that a wireless communication medium (e.g., radio frequency channel) can provide. The communication system provides a generalized transmission data rate adaptation scheme, wherein transmission data rate can be smoothly adapted to a desired rate based on available communication bandwidth, with minimal video quality degradation. This is termed a progressive transmission data rate adaptation (or simply progressive rate adaptation), herein.

Such a progressive transmission data rate adaptation communication system according to an embodiment of the invention is configured for: (1) performing progressive pixel differential transformation wherein difference values for video pixels are systematically compressed and transmitted for progressive rate adaptation, and (2) if the data rate is too high for available channel bandwidth, performing progressive pixel dropping wherein systematically pixels at different positions are evenly dropped for progressive rate adaptation. The communication system maintains a set of pixel differential transformation modes and pixel dropping modes, and provides systematic switching among these modes to achieve progressive rate adaptation.

One implementation of the progressive rate adaptive communication system is configured for uncompressed video transmission from a wireless transmitter to a wireless receiver, utilizing simple spatial domain processing. Progressive pixel differential transformation is performed such that difference values of video pixels are systematically represented for progressive rate adaptation. The data rate can be adjusted at granular levels by gradually changing the number of pixels carrying the difference values instead of original values.

The positions of the pixels that carry difference values (i.e., target pixels) are selected to reduce or minimize visual quality degradation, and also to ease error recovery at the receiver side.

If the data rate is higher than the available channel bandwidth after progressive pixel differential transformation, then progressive pixel dropping (discarding) is performed such that pixels at different positions are systematically evenly dropped for progressive rate adaptation. The data rate can be adjusted at granular levels by gradually changing the number of pixels to be dropped. The positions of the pixels to be dropped are selected to minimize visual quality degradation and also to ease error recovery at the receiver side.

One implementation provides transmitting video information over a wireless communication medium by obtaining original pixel information of uncompressed video pixels, and performing progressive transmission data rate adaptation on selected pixel information to obtain rate-reduced pixel information, wherein the rate-reduced pixel information requires a lower transmission data rate than the original pixel information. The rate-reduced pixel information is transmitted from a wireless sender device over the wireless communication medium to a wireless receiver device.

Progressive transmission data rate adaptation includes performing successive data rate adaptation operations on pixel information of selected pixels to reduce transmission data rate of their pixel information, wherein each successive data rate adaptation operation further reduces transmission data rate of said pixel information, for adaptation to available bandwidth of the wireless communication medium. Performing successive data rate adaptation operations may include performing successive pixel differential transformation modes, such that each pixel differential transformation mode further reduces transmission data rate of the selected pixel information.

Further, performing each data rate adaptation operation on selected pixels may include performing a pixel differential transformation mode on pixels in a block of selected pixels including an initial pixel and proximate spatially correlated pixels. Performing a pixel differential transformation mode may include performing a pixel differential transformation mode on pixel information of selected pairs of reference and target pixels in the block.

A pixel differential transformation mode for a reference pixel and a target pixel includes performing a pixel differential operation including: determining pixel differential information comprising a difference between current pixel information of the reference pixel and current pixel information of the target pixel, and replacing the current pixel information of the target pixel with the pixel differential information. The selected pixels positions are evenly distributed in each block to minimize visual quality degradation.

FIG. 1 shows a block diagram of a progressive rate adaptive communication system 10 for uncompressed video transmission over a wireless channel from a sender device 11 to a receiver device 12, according to an embodiment of the invention. At the sender device 11, an uncompressed video input module 13 (e.g., a video decoder or uncompressed HD video recorder) provides information comprising uncompressed video to a wireless transmitter 14 via wired interface such as HDMI (High Definition Media Interface). The transmitter 14 uses millimeter wave wireless (mmWave) technologies to transmit that information to a wireless receiver 15 at the receiver device 12, over a wireless channel. For lower video format such as 480p, other wireless technologies such as UWB (Ultra Wide Band) or 802.11n may be used. At the receiver device 12, the wireless receiver 15 provides the received information to an uncompressed video playback module 16 (e.g., can be a HDTV (High-Definition TV), a monitor, a projector, etc.) via another wired interface.

The sender 11 includes a rate adaptation module configured for performing progressive transmission data rate adaptation on selected pixels information of original pixel information for uncompressed video pixels, to generate rate-reduced pixel information, wherein the rate-reduced pixel information requires a lower transmission data rate than the original pixel information. The sender 11 further includes a communication module configured for transmitting the rate-reduced pixel information over the wireless communication medium to a wireless receiver device. The receiver 12 includes a communication module for wireless communication, and a recovery module configured for performing a reverse operation of the sender to recover the original uncompressed video pixel information.

Figure 2:
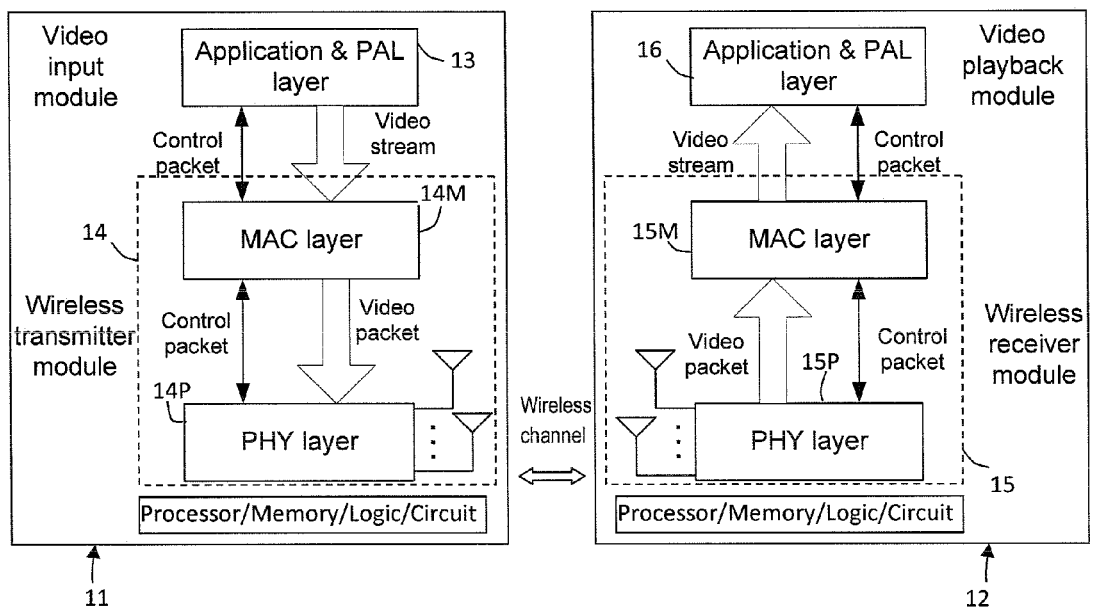
FIG. 2 shows a more detailed diagram of the communication system of FIG. 1, according to an embodiment of the invention.

FIG. 2 illustrates in more detail a progressive rate adaptive implementation for uncompressed video transmission in the system 10 comprising a wireless network, according to an embodiment of the invention. At the sender side 11, the video input module 13 comprises a processing module including an Application & PAL (Protocol Adaptation Layer) layer which continuously streams a video stream to a Media Access Control (MAC) layer 14M in the wireless transmitter 14. The MAC layer packetizes the video stream into MAC packets and moves the packets down to a physical (PHY) layer 14P to transmit to the receiver device 12 over a wireless channel.

At the receiver side, a PHY layer 15P of the wireless receiver 15 receives the packets and provides the packets to a MAC layer 15M. The MAC layer 15M de-packetizes the packets and then provides the video information to the video playback module 16 comprising a processing module including an Application & PAL layer. Dynamic rate adaptation comprising progressive rate adaptation is employed in the system 10 to provide stable video streaming requirements for end-users. The operation of the system 10 is described below, according to an embodiment of the invention.

According to an embodiment of the invention, at the MAC layer 14M of the sender device 11, video packets are created from video information provided by the video input module 13, based on a pixel block (or sub-block) format for pixel partitioning. A pixel block of M×N means a group of neighboring digital image pixels which have N rows and M columns of pixels. During processing, all pixels in a pixel block are separated and placed into different pixel partitions.

Figure 3:
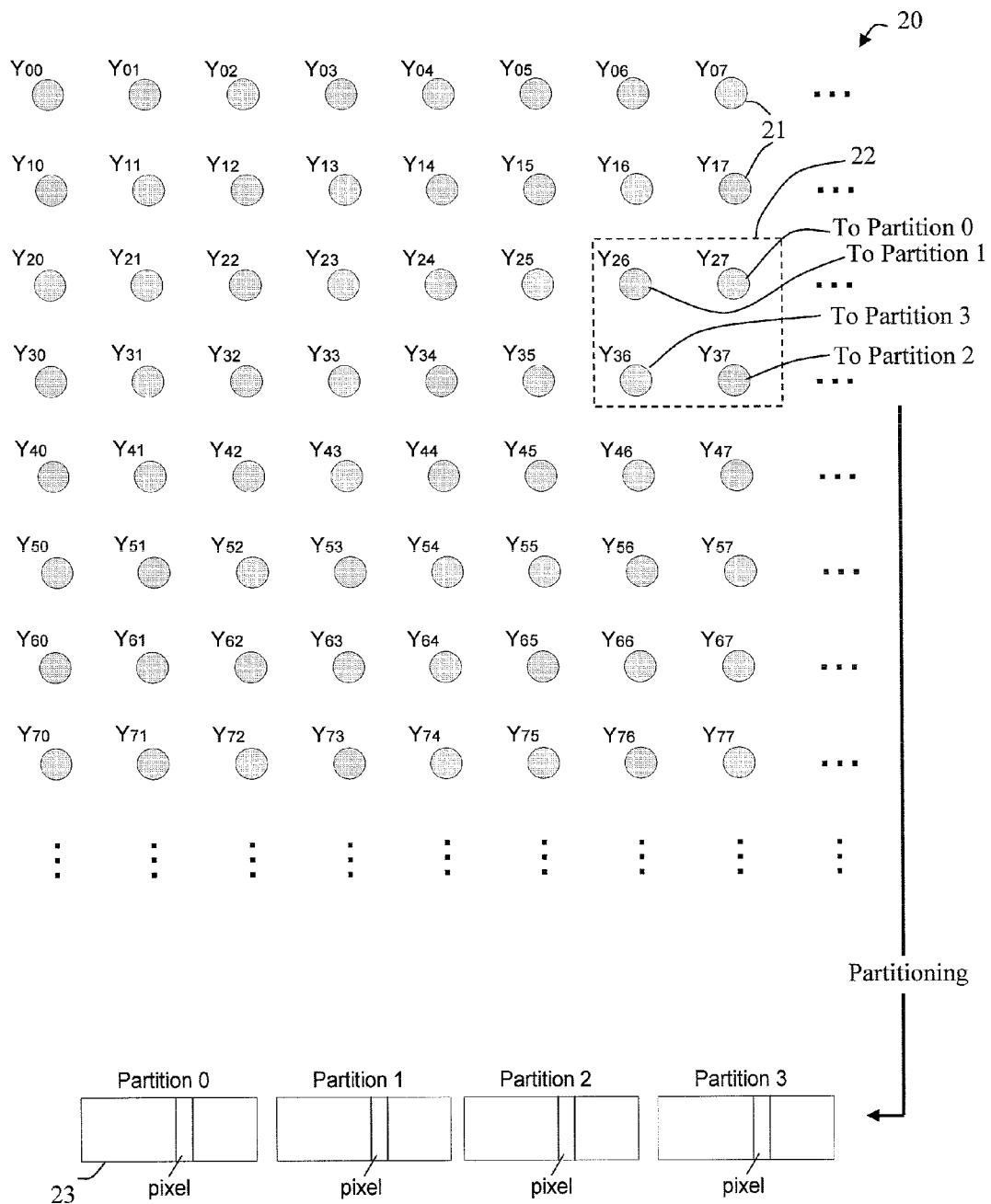
FIG. 3 shows a representation of an example two-dimensional uncompressed video image frame of pixels, according to an embodiment of the invention.

FIG. 3 shows a representation of an example two-dimensional uncompressed video image frame 20 of pixels 21. The pixels 21 are graphically represented by symbols "o". In this example, a 2×2 pixel block 22 is used for mapping pixels in a device memory into four pixel partitions 23 (e.g., Partition 0, Partition 1, Partition 2, Partition 3). The partitions are placed into packets at the sender MAC layer 14M, and wirelessly transmitted to the receiver via the sender PHY layer 14P over a wireless medium. At the receiver, the received packets at the receiver PHY layer 15P are de-packetized by the receiver MAC layer 15M, and further processed by the receiver application layer 16 for reconversion to uncompressed video.

Pixel block size is determined according to sender device memory buffer capability and video format/content. For example, if only 8 lines (rows) of uncompressed video can be buffered for signal processing due to latency requirement and in-chip buffer size limitation, the maximum pixel block size is 8×M (M≥1). Video content and video resolution format also affect the selection of pixel block size.

Pixels in the same pixel block usually have similar values. For high video resolution such as 1929×1080, typically pixels in an 8×8 pixel block have very similar values. However, for lower video resolution such as 800×600, typically pixels in a 4×4 pixel block have similar values and 8×8 may be too large as pixel block size. The pixels in a block are spatially correlated. Different pixels in a pixel block are placed into different partitions.

According to an embodiment of the invention, if the actually allocated wireless channel bandwidth can accommodate the transmission data rate required for the incoming (original) video stream from the input module 13, then original value of every pixel in a pixel block 22 is utilized. FIG. 3 illustrates an example frame 20 of video pixels 21 at Cartesian coordinates (n, m) having corresponding values Ynm (i.e., Y00, Y01, . . . ). The pixel values represent video information. The integer values n≥0 and m≥0, represent pixel row and column coordinates, respectively.

FIG. 3 shows a 1×1 pixel differential transformation mode of the progressive rate adaptation process. In this mode, the original values of all the pixels in each pixel block are used in partitions 23 for transmission from the sender device to the receiver device.

Progressive Rate Adaptation

According to an embodiment of the invention, if the actually allocated wireless channel bandwidth cannot accommodate the transmission data rate required for the incoming (original) video stream from the input module, then to lower the transmission data rate, progressive rate adaptation is utilized. In one implementation, progressive rate adaptation comprises a progressive pixel differential transformation (PPDT) process and a progressive pixel dropping (PPDR) process, wherein the PPDT and PPDR processes can be applied separately or in combination, as described in more detail hereinbelow.

Progressive Pixel Differential Transformation

Figure 4:
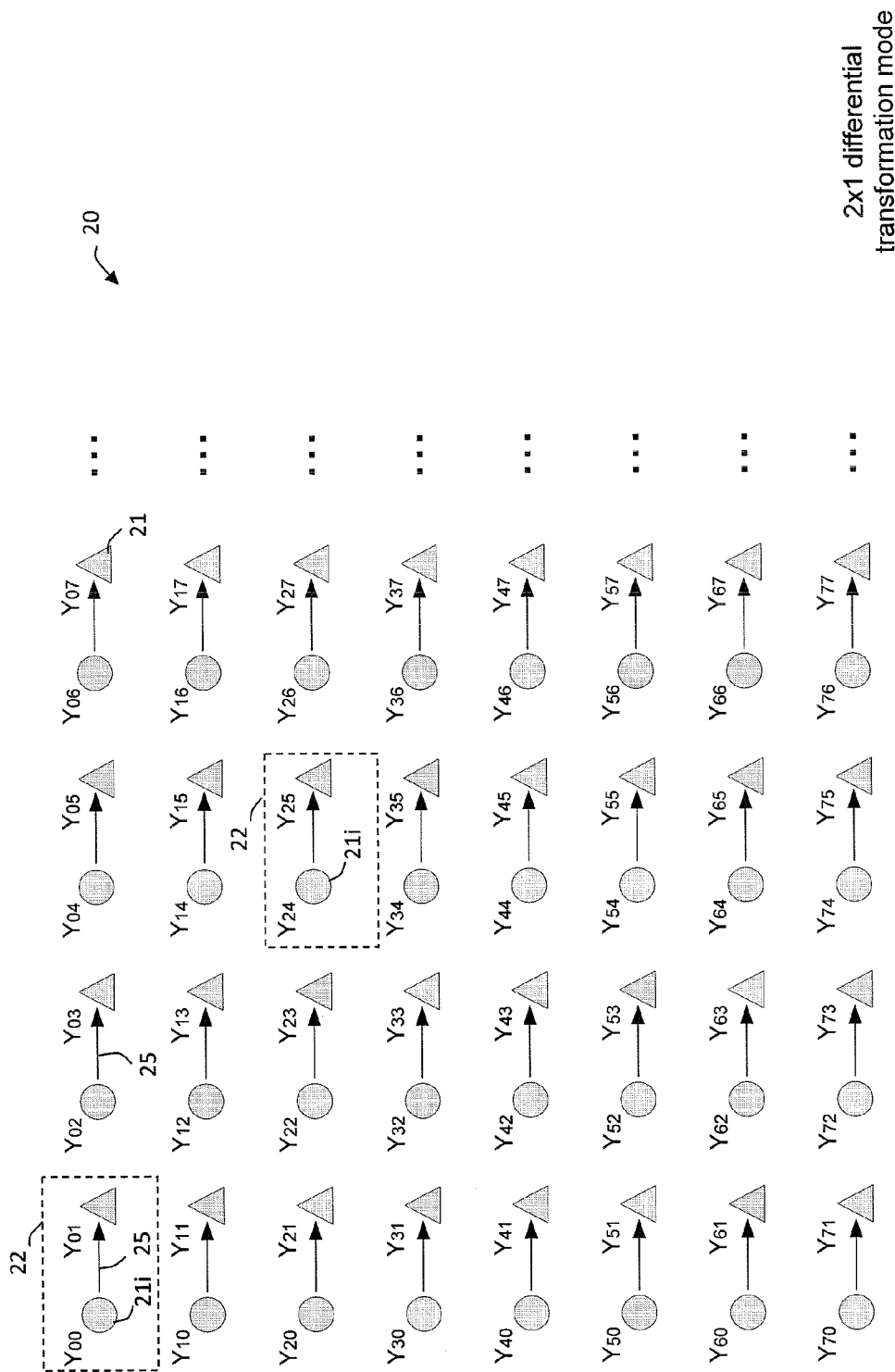
FIGS. 4-9 illustrate examples of progressive rate adaptation comprising successive application of pixel differential transformation modes on video information of an uncompressed video image frame, according to an embodiment of the invention.

For example, FIG. 4 shows a 2×1 pixel differential transformation mode. In each 2×1 pixel sub-block 22, for a target pixel such as a pixel at a coordinate (n=i, m=2j−1), the corresponding pixel value $Y_{i(2j+1)}$, is replaced by a value difference D based on the value $Y_{i(2j)}$ of a reference pixel, such as a previous pixel at a coordinate (n=i, m=2j), on the same row, such that $D=Y_{i(2j+1)}-Y_{i(2j)}$. In the description herein i≥0 is an integer and j≥0 is an integer. Further, in the figures, a circle symbol "o" represents the original pixel value and a triangle symbol "Δ" represents a difference value D.

According to the progressive pixel differential transformation process, at the transmitter side, each target pixel to carry the calculated differential value is selected in a way to reduce error propagation from a reference pixel. Further, each calculated differential value for a target pixel is then used in a progression for a further differential calculation when the target pixel may function as a reference pixel for a next calculation for a next target pixel. This provides a systematic and iterative calculation of difference values, wherein previously calculated difference values in one pixel differential transformation mode are used for calculating further difference values in a next pixel differential transformation mode to reduce the data rate required for transmitting video information. Similarly, at the receiver side a reverse process is used to recover the original pixel values, reducing calculation overhead. The number of pixel differential transformation modes applied may be selected based on factors including, for example, sender/receiver buffer availability, calculation delay, and pixel block size.

For example in FIG. 4, for i=0, j=0, the target pixel value $Y_{01}$ is replaced by a difference D between pixel values of the reference pixel at frame location (0,0) and the target pixel at frame location (0,1), wherein $D=Y_{01}-Y_{00}$. Similarly, for i=0, j=1, the target pixel value $Y_{03}$ is replaced by difference $D=Y_{03}-Y_{02}$, wherein the pixel at frame location (0,2) is the reference pixel, and so on.

In FIG. 4, each arrow 25 between a pair of pixels in a row is directed from a reference pixel to a target pixel, wherein the arrow represents a pixel differential calculation involving determining a difference D between the current pixel information of the reference pixel and the current pixel information of the target pixel. After D is determined, the pixel information of the target pixel is replaced with the determined difference D, wherein as a result of that replacement the target pixel then carries the pixel differential information D as the current pixel information for the target pixel. The same definition applies to each arrow between a pair of pixels (row-wise and column-wise) in FIGS. 5-9.

After completing the differential transformation mode, for each target pixel where a difference D is computed, the difference value D is stored in a location in partition 23 corresponding to said original pixel, rather than original pixel value of the target pixel.

Figure 5:
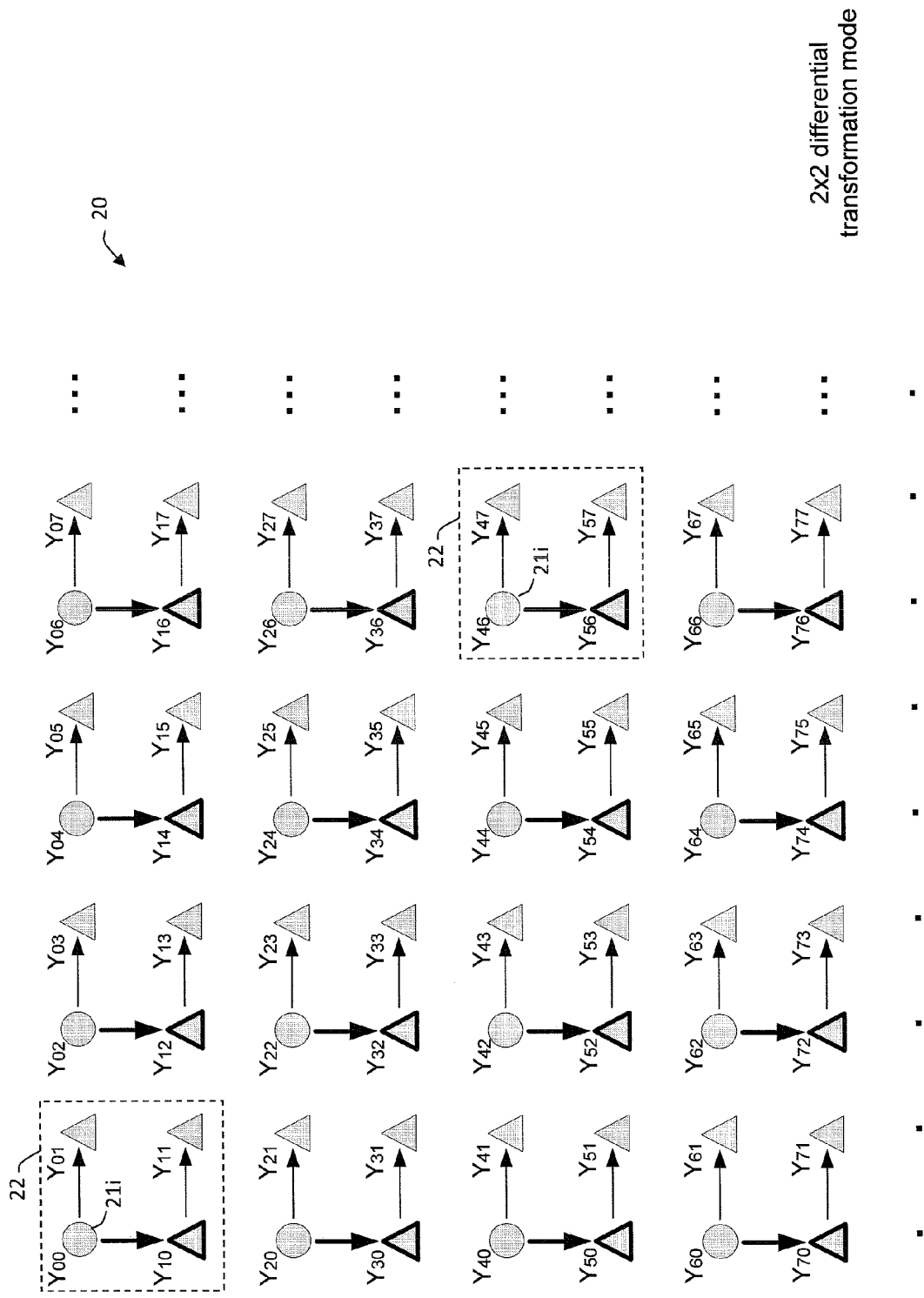

To further lower the data rate (i.e., progressively adapt the required data rate to the allocated wireless channel bandwidth), a 2×2 differential mode can be applied as shown by the pixel differential transformation mode in FIG. 5, according to an embodiment of the invention. In each 2×2 pixel sub-block 22, from the results of 2×1 differential mode above, in each column 2j, pixel value $Y_{(2i+1)(2j)}$ is replaced by the difference value $Y_{(2i+1)(2j)}-Y_{(2i)(2j)}$, from the previous pixel on the same column. In FIG. 5, down arrows indicate operation additions to the 2×1 differential mode.

Figure 6:
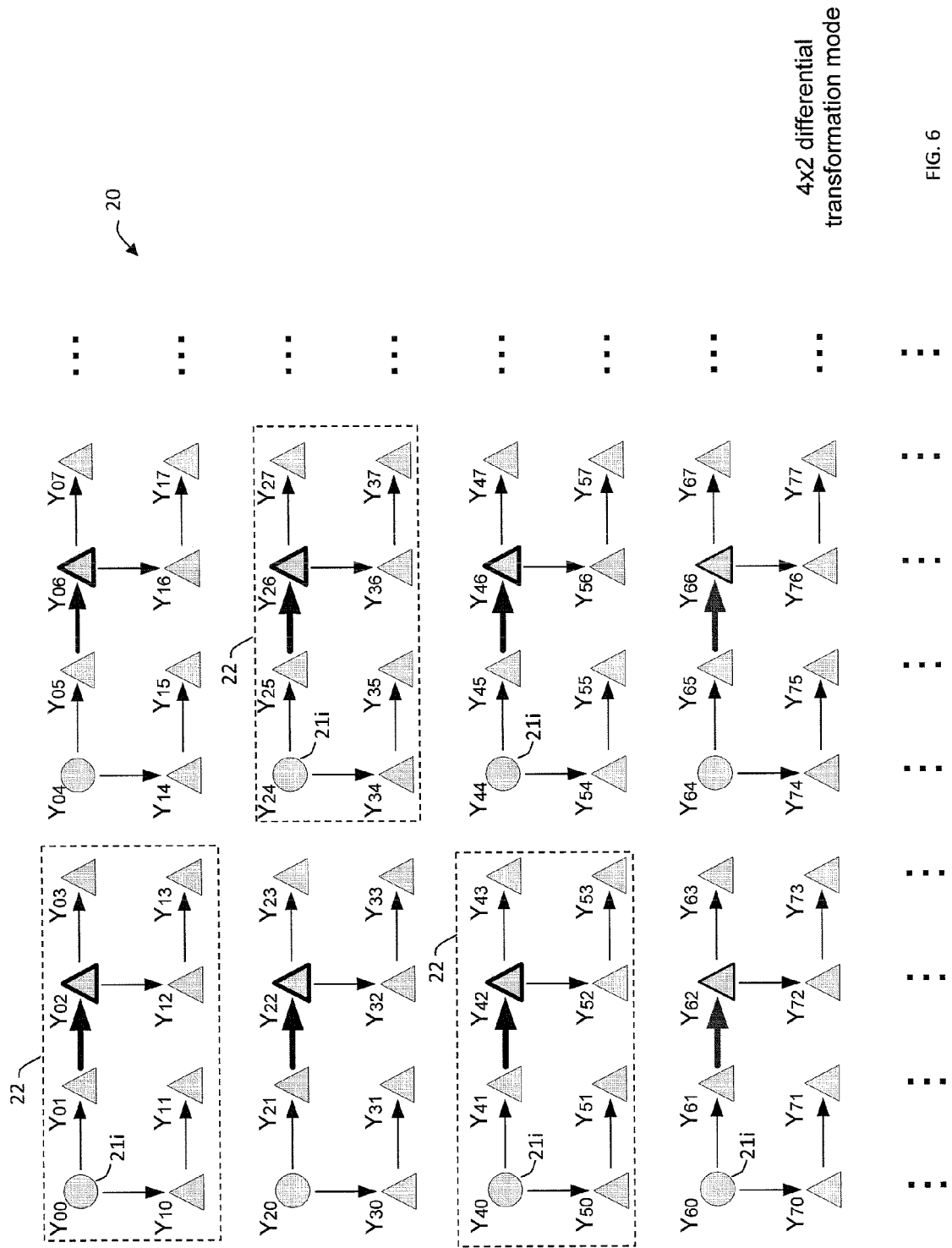

To further lower the data rate (i.e., progressively adapt the required data rate), a 4×2 differential mode can be applied as shown by the pixel differential transformation mode in FIG. 6, according to an embodiment of the invention. In each 4×2 pixel sub-block 22, from the results of 2×2 differential mode above, in each row 2i, pixel value $Y_{(2i)(4j+2)}$ is replaced by the difference value $Y_{(2i)(4j+2)}-Y_{(2i)(4j+1)}$, from the previous pixel on the same row. Since the value at the pixel position of $Y_{(2i)(4j+1)}$ is $Y_{(2i)(4j+1)}-Y_{(2i)(4j)}$, the value calculation for the value at position $Y_{(2i)(4j+2)}$ has two steps: $Y_{(2i)(4j)}+Y_{(2i)(4j+1)}-Y_{(2i)(4j)}=Y_{(2i)(4j+1)}$, and then the value for the value at position $Y_{(2i)(4j+2)}$ is the difference $D=Y_{(2i)(4j+2)}+Y_{(2i)(4j+1)}$. In this example, $Y_{01}$ is for reference pixel at frame location (0,1) and D is for the target pixel at frame location (0,2). In FIG. 6, bolded arrows indicate operation additions to the 2×2 differential mode.

Figure 7:
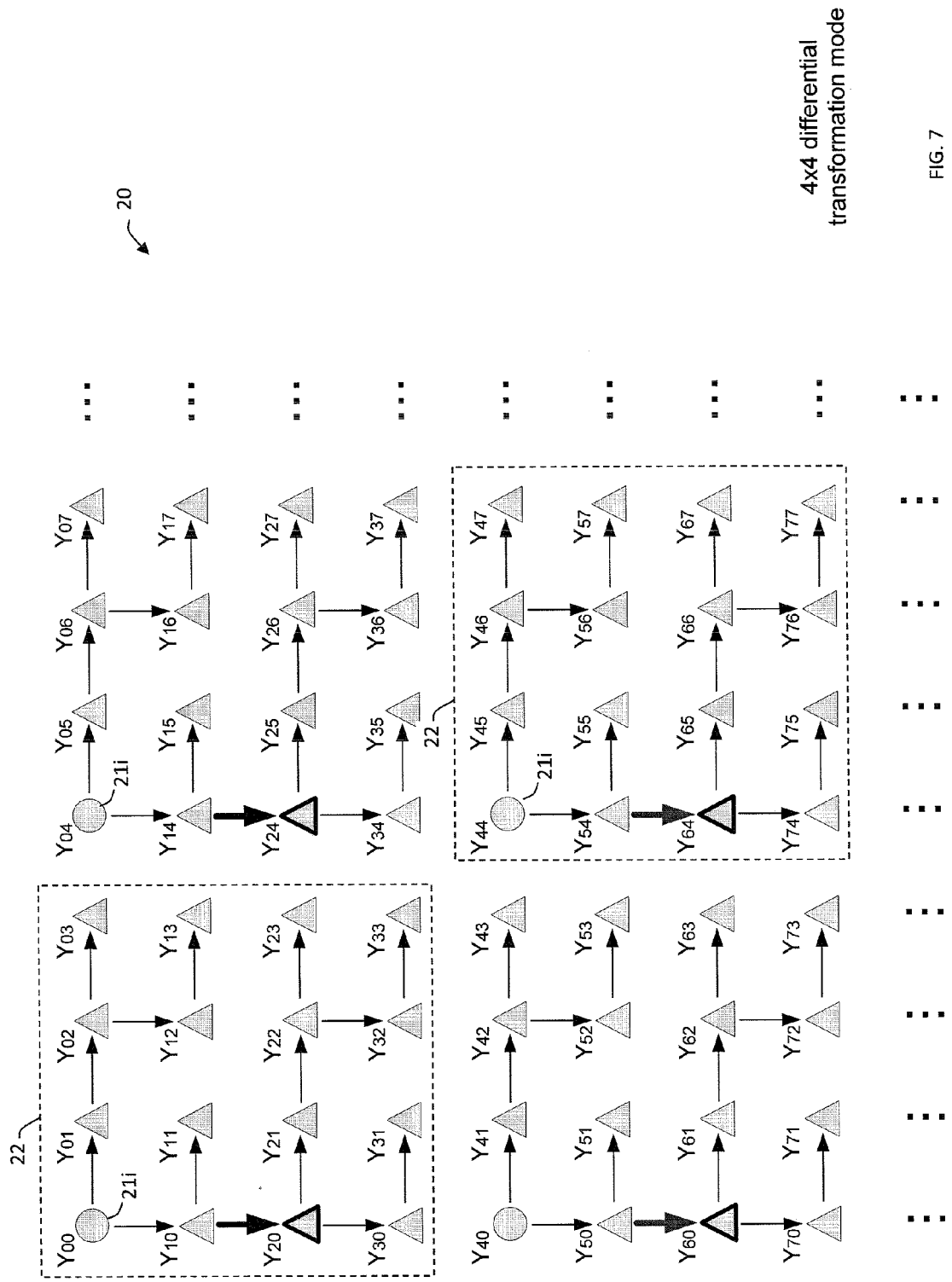
Figure 8:
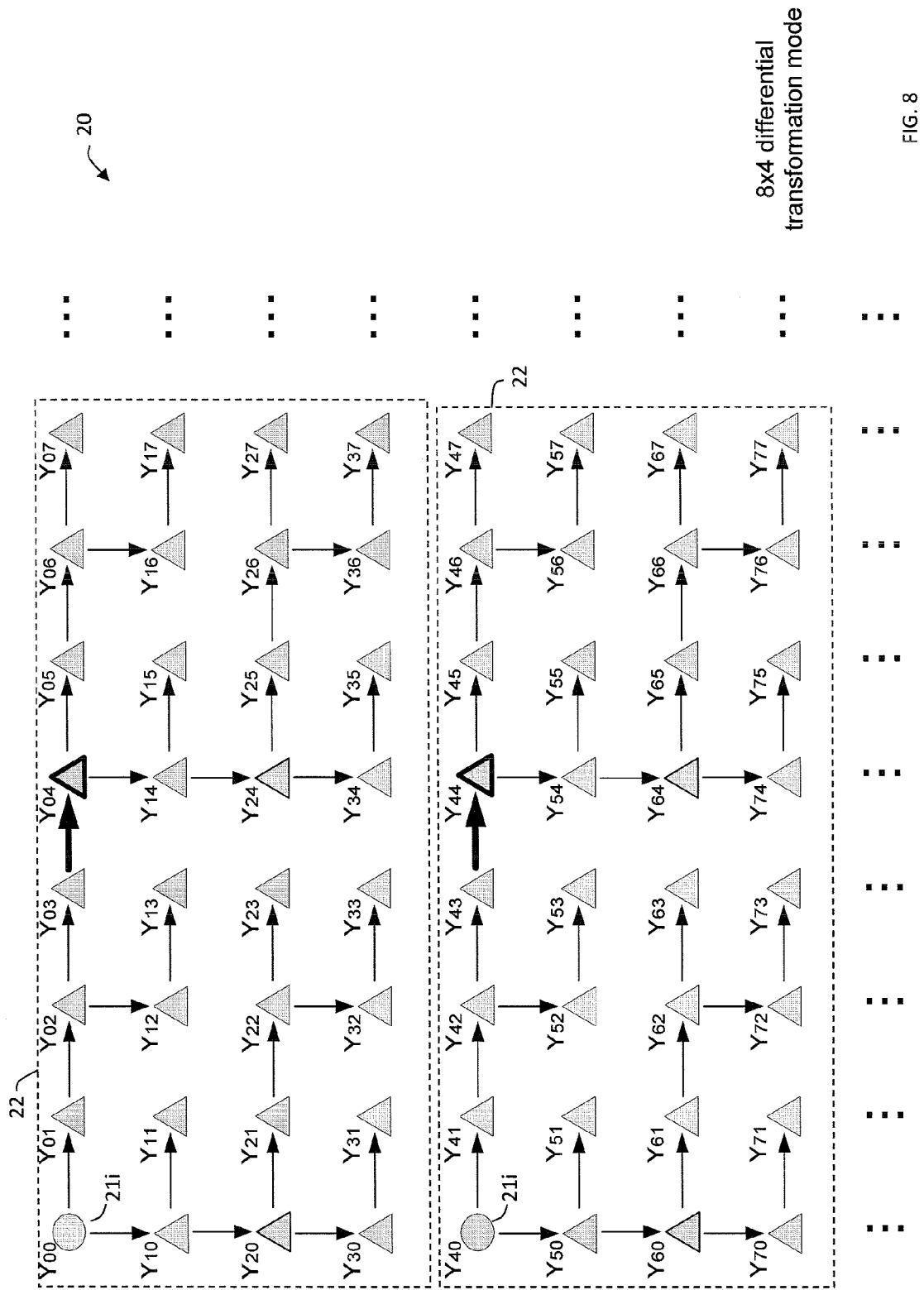
Figure 9:
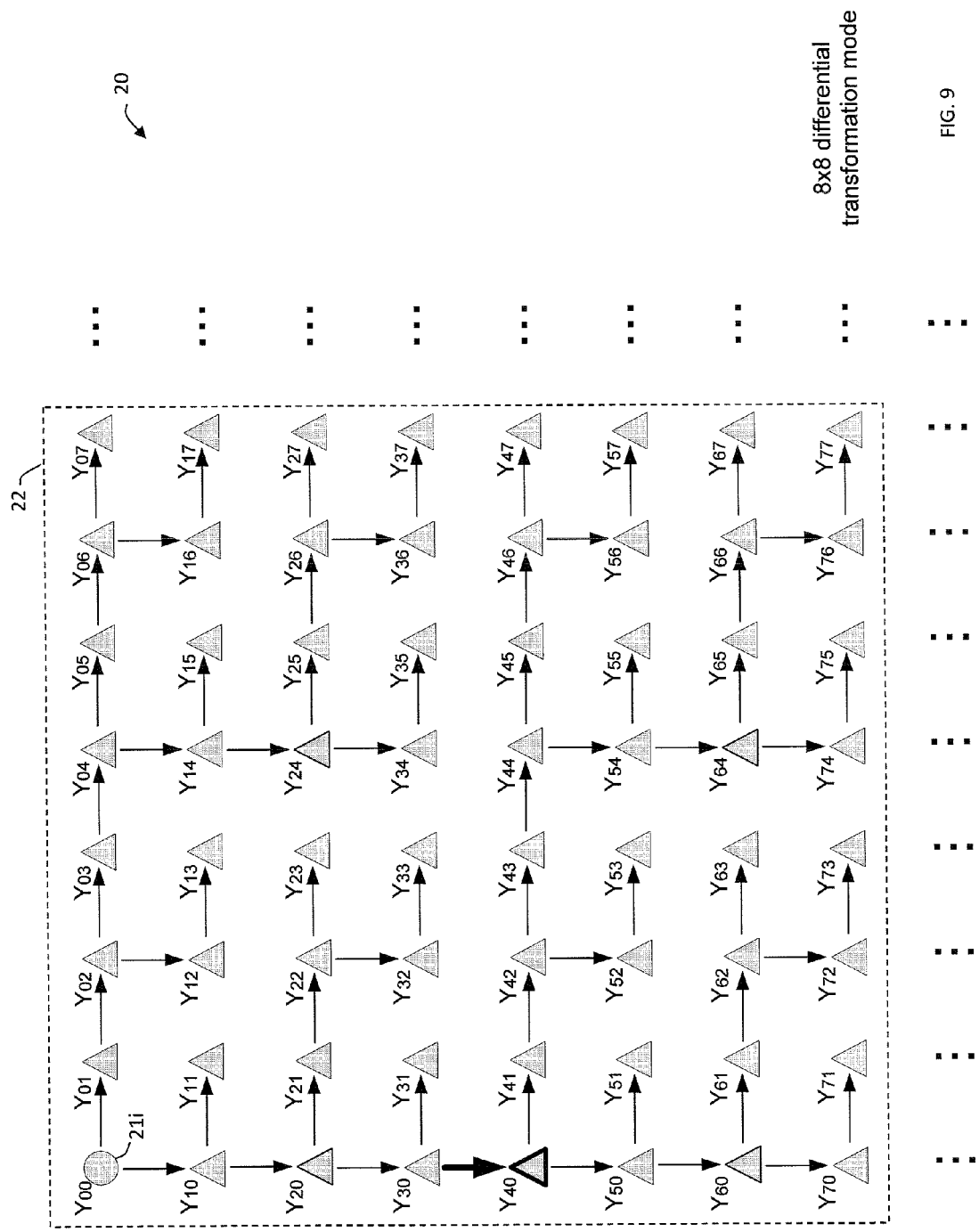

Other example data rate reductions for 4×4, 8×4 and 8×8 pixel differential transformation modes for progressively adapting the required date rate, are shown in order in FIGS. 7-9, respectively, according to embodiments of the invention (bolded arrows in each figure indicate operation additions to the immediately preceding previous differential mode).

As such, FIGS. 4-9 show progressive application of successive pixel differential modes 2×1, 2×2, 4×2, 4×4, 8×4, 8×8, respectively, on a video frame 20, according to one embodiment of the invention. For example, the output of 2×1 pixel differential transformation mode application on the frame 20 in FIG. 4 comprising a first rate-reduced frame (frame requiring a lower transmission data rate than the original frame), is used as the input for 2×2 pixel differential mode application in FIG. 5. The output of 2×2 pixel differential mode application on the frame 20 in FIG. 5 comprising a second rate-reduced frame (requiring a lower transmission data rate than the first rate-reduced frame), is used as the input for 4×2 pixel differential mode application in FIG. 6, and so on.

Each pixel block 22 includes an initial pixel 211 that maintains an original pixel value. According to embodiments of the invention, for each pixel differential transformation mode, in each pixel block 22 the target pixels to carry difference values are selected based on three criteria.

First, the selected pixels are evenly distributed in a pixel block (and also the video frame) to minimize visual quality degradation.

Second, the selected pixels reduce (and preferably minimize) the overall average, and also maximum dependence length from an initial pixel 211 to pixels carrying difference values. In FIGS. 4-22, dependence length between two pixels in a pixel block 22 is a count of the number of arrows 25 between the two pixels. For example, in FIG. 6, in each pixel block the maximum dependence length from an initial 21$i$ in the pixel block is 4 (i.e., Y00->Y01->Y02->Y12->Y13) and the average dependence length is 2, which minimizes dependence length for the involved pixel block (this in turn minimizes propagation error). The overall average dependence length in each pixel block is the ratio of the sum of all dependence lengths in the pixel block, to the number of pixels in the block.

Third, the selected pixels allow systemic and automatic iterations of progressive pixel differential transformation modes from FIG. 4 to FIG. 9, wherein the pixels are selected in row-wise (horizontal) first and then column-wise (vertical). The row-wise and column-wise selection alternate from one pixel differential mode to the next.

Each mode of the progressive pixel differential transformation process provides a rate-reduced frame which requires a lower transmission data rate than a prior rate-reduced frame in the progression.

After pixel differential transformation, certain pixel values carrying said difference values may become very small. For example, if an original pixel value is 230, a difference value may be only 2 since usually the value difference between neighboring pixels is very small. If in one partition 23, most pixels have very small values, then the high order bit planes (e.g., most significant bits (MSB)) of the pixel values will have "zeros" in most percentage. This reduces the required transmission rate for the video frame since the difference value in a target pixel contains less information to be transmitted than a previous value of the target pixel. Further, compression of the difference values may be performed. For example, a lossless compression scheme such as Huffman coding or Run-length coding (RLC) can be applied to the pixel partitions 23 to reduce the amount of bits used for each pixel partition 23. Then, RLC can be applied to high order bit planes to compress the information in the partition (i.e., partition compression).

In one example, the uncompressed video data rate to be transmitted from a sender device to a receiver device can be progressively reduced using differential modes for 2×1, 2×2, 4×2, 4×4, 8×4, 8×8 pixel blocks, while essentially maintaining video quality. Further, multiple pixel differential transformation modes can be performed in one. For example, an 8×8 pixel differential transformation mode can be applied directly after a 2×2 pixel differential transformation mode. Rate adaptation with pixel differential transformation may be performed in the reverse direction if the wireless channel condition improves and higher data rate is available.

Progressive Pixel Dropping

According to an embodiment of the invention, if the actually allocated wireless channel bandwidth still cannot accommodate the transmission data rate required after performing progressive rate adaptation with pixel compression on the uncompressed video information at the sender device, then one or more pixel partitions can be progressively dropped to further reduce that data rate and maintain stable and acceptable video quality. The dropped pixels are preferably evenly distributed in each pixel block 22 in order to maintain acceptable visual video quality and simplified pixel recovery and error resilience at the receiver side.

In one implementation at the sender device, a pixel dropping mode N×M: k means that in an N×M block 22 in a video frame 20, k pixels are dropped. In each pixel dropping mode, typically the target pixels are dropped based on their distance from a first pixel of the sub-block. A target pixel with the longest distance to a reference pixel (e.g., first pixel at location (0,0)) of the pixel block is dropped first. In other words, a target pixel with the longest error propagation path from the reference pixel in the pixel block is dropped first. In the figures, a path between any two pixels comprises a set of arrows connecting two pixels, wherein the length of the path is represented by the number of arrows in the path. Dropping a target pixel so selected reduces impact on other pixels for video quality at the receiver device.

Figure 10:
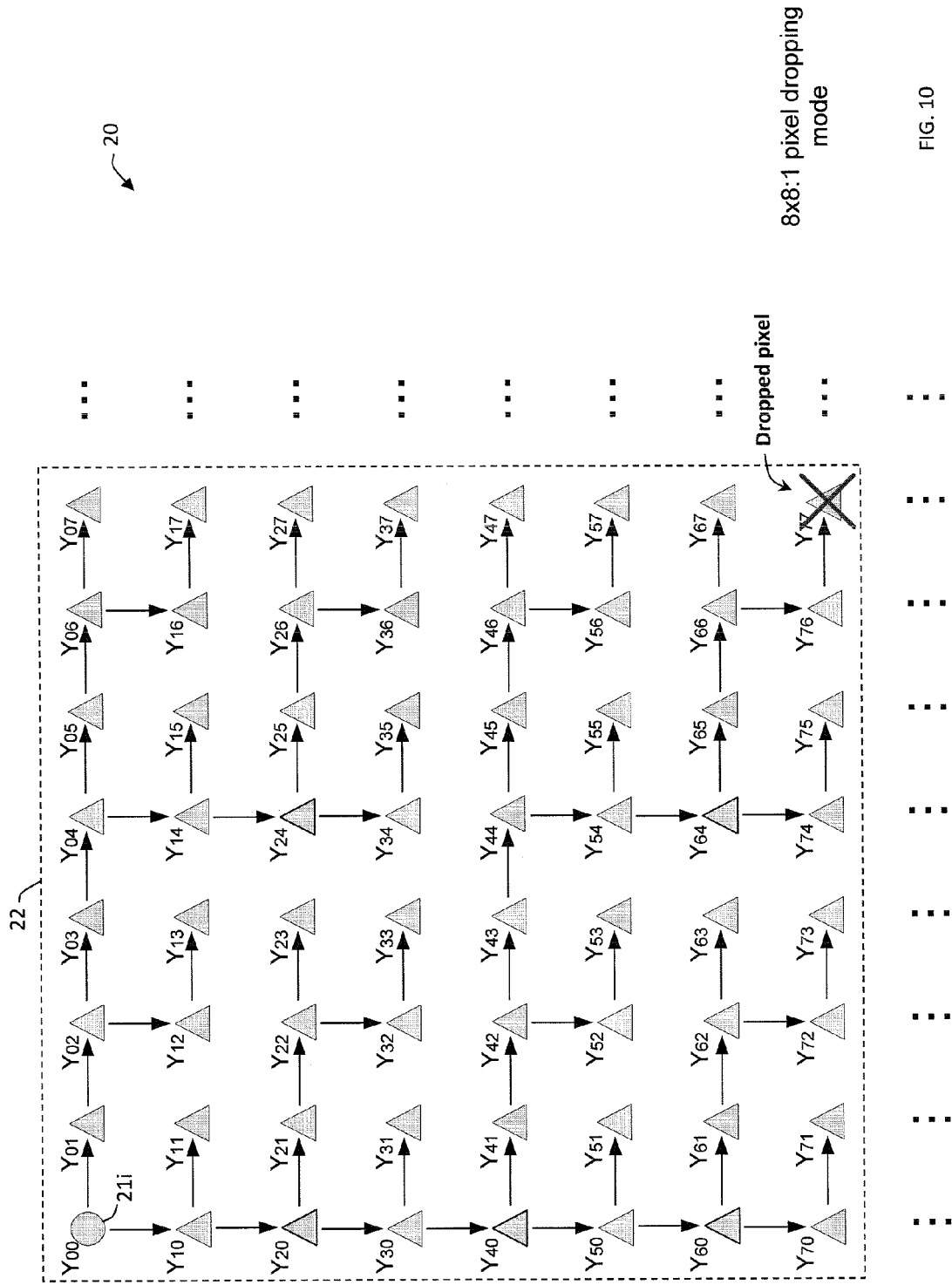
FIGS. 10-22 illustrate examples of progressive rate adaptation comprising successive application of pixel dropping modes on video information of a video image frame, according to an embodiment of the invention.
Figure 11:
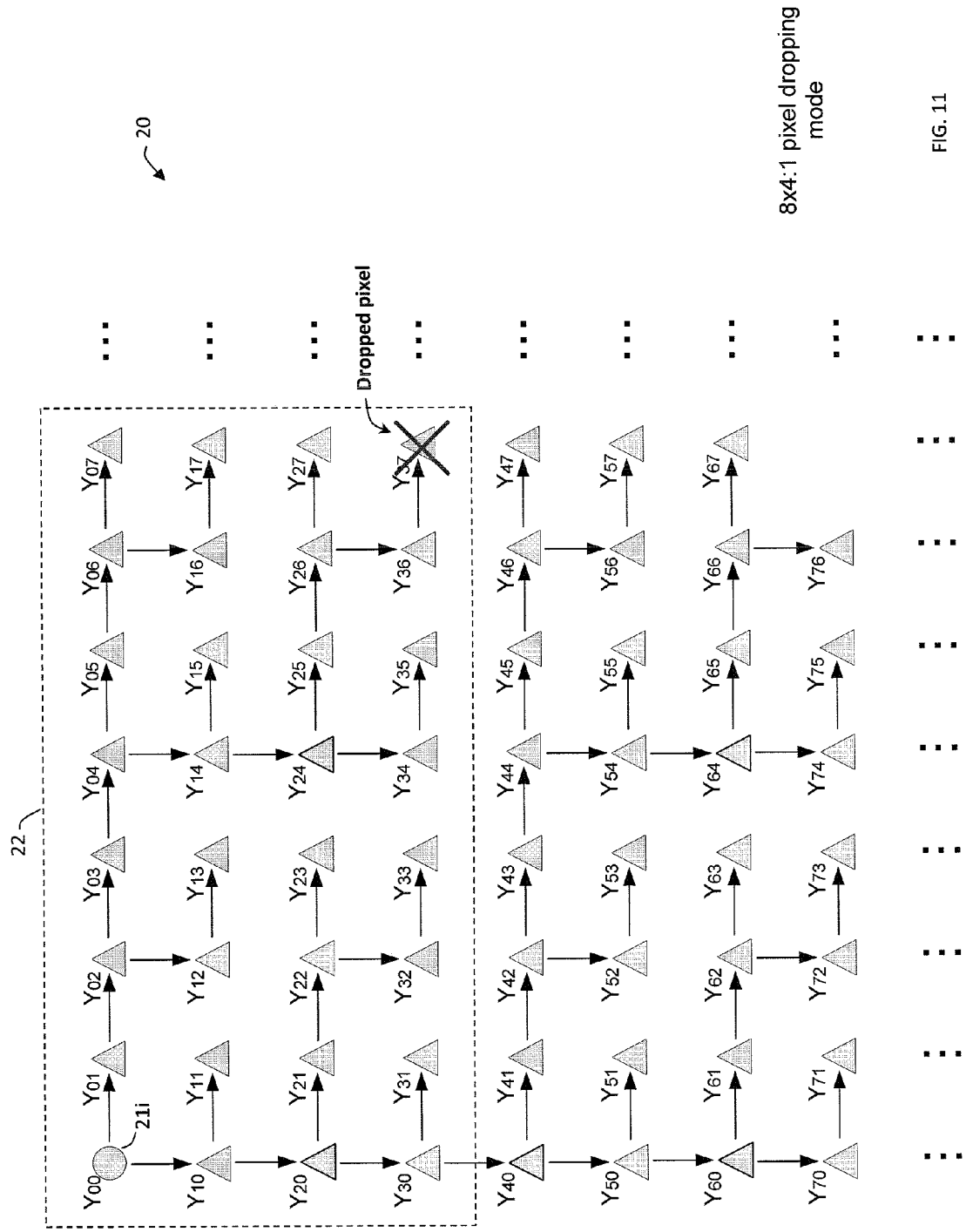

FIG. 10 shows an example pixel dropping mode 8×8:1 according to the invention, wherein the sub-block size 22 is 8×8 and pixel dropping mode is k=1. As such, pixels $Y_{(8i+7)(8i+7)}$ are dropped in a pixel dropping mode 8×8:1. In this example, N=8, M=8, k=1, and pixel identified as $Y_{(8i+7)(8i+7)}$ in each 8×8 pixel sub-block is dropped. In another example pixel dropping mode shown in FIG. 11, to further reduce the data rate, in a pixel dropping mode 8×4:1, the pixels $Y_{(4i+3)(8j+7)}$ are dropped.

Figure 12:
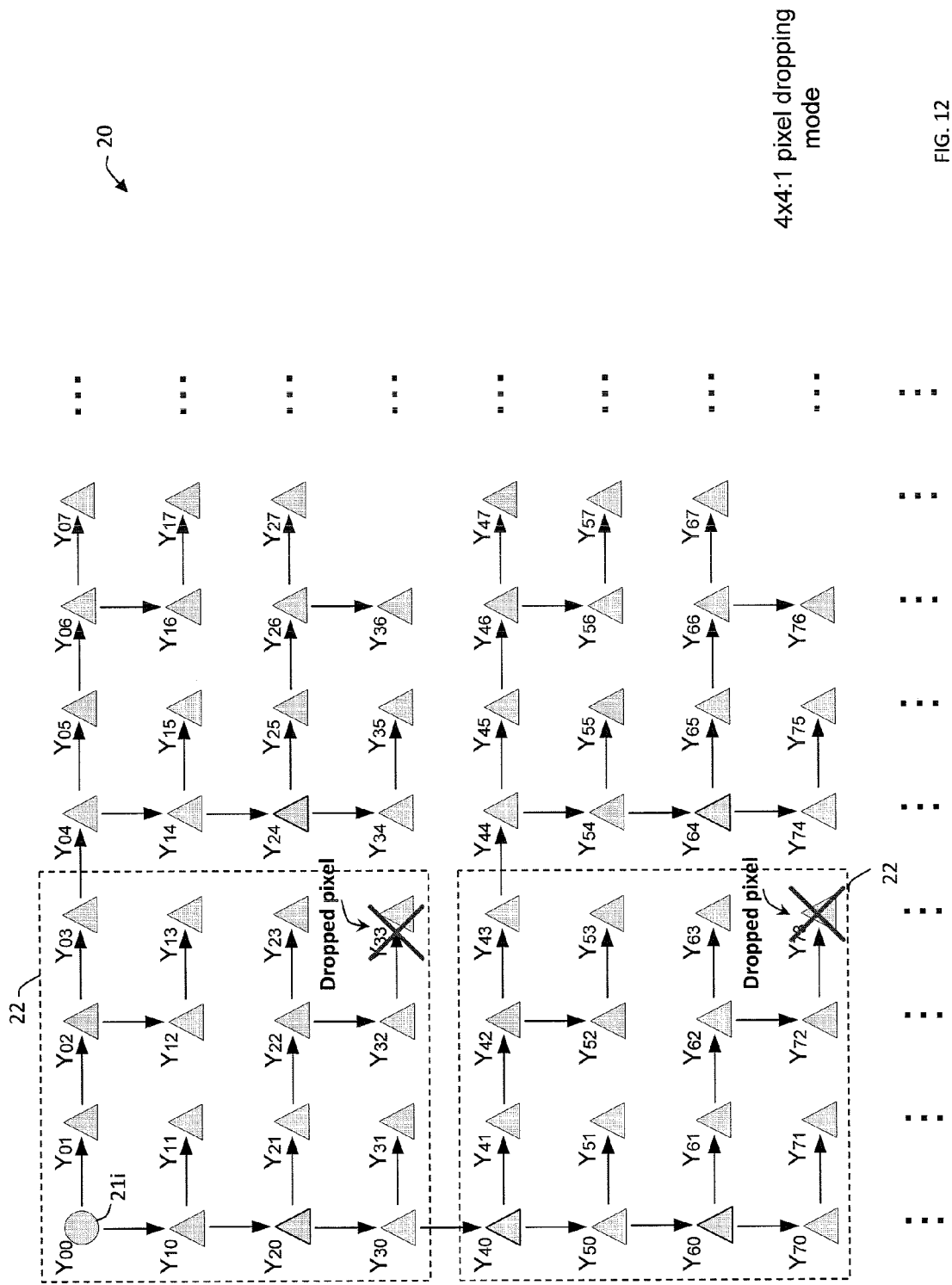
Figure 13:
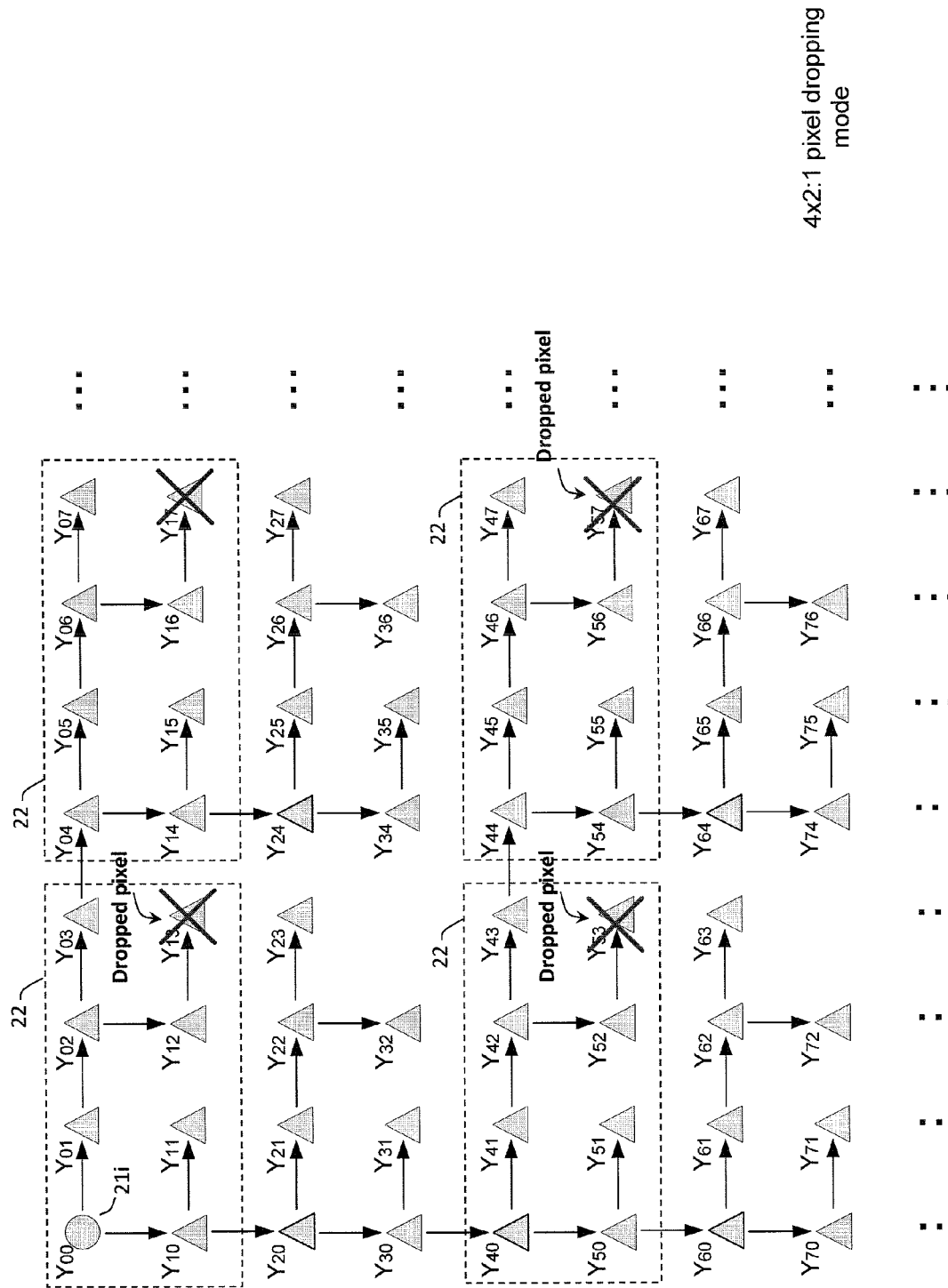
Figure 14:
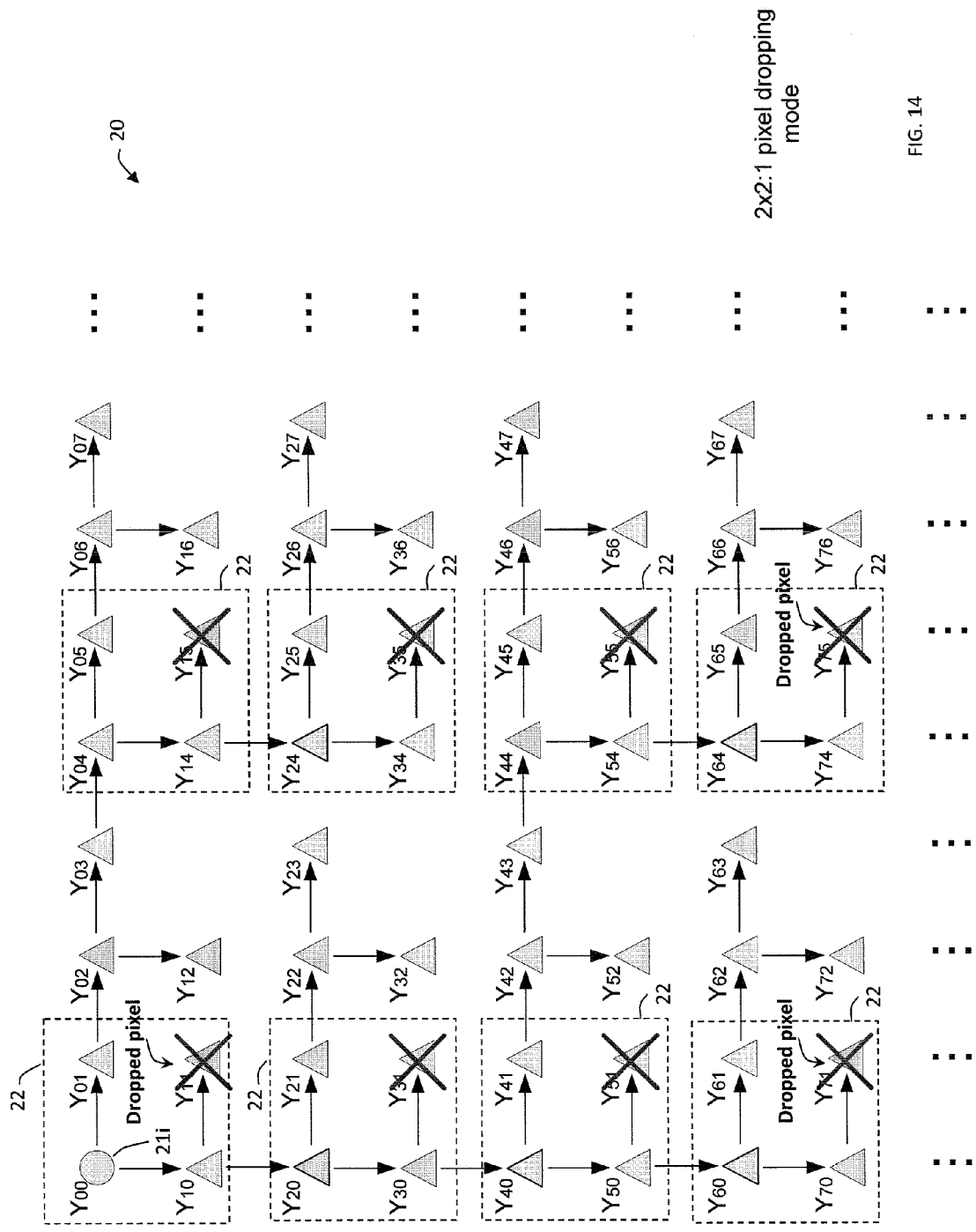
Figure 15:
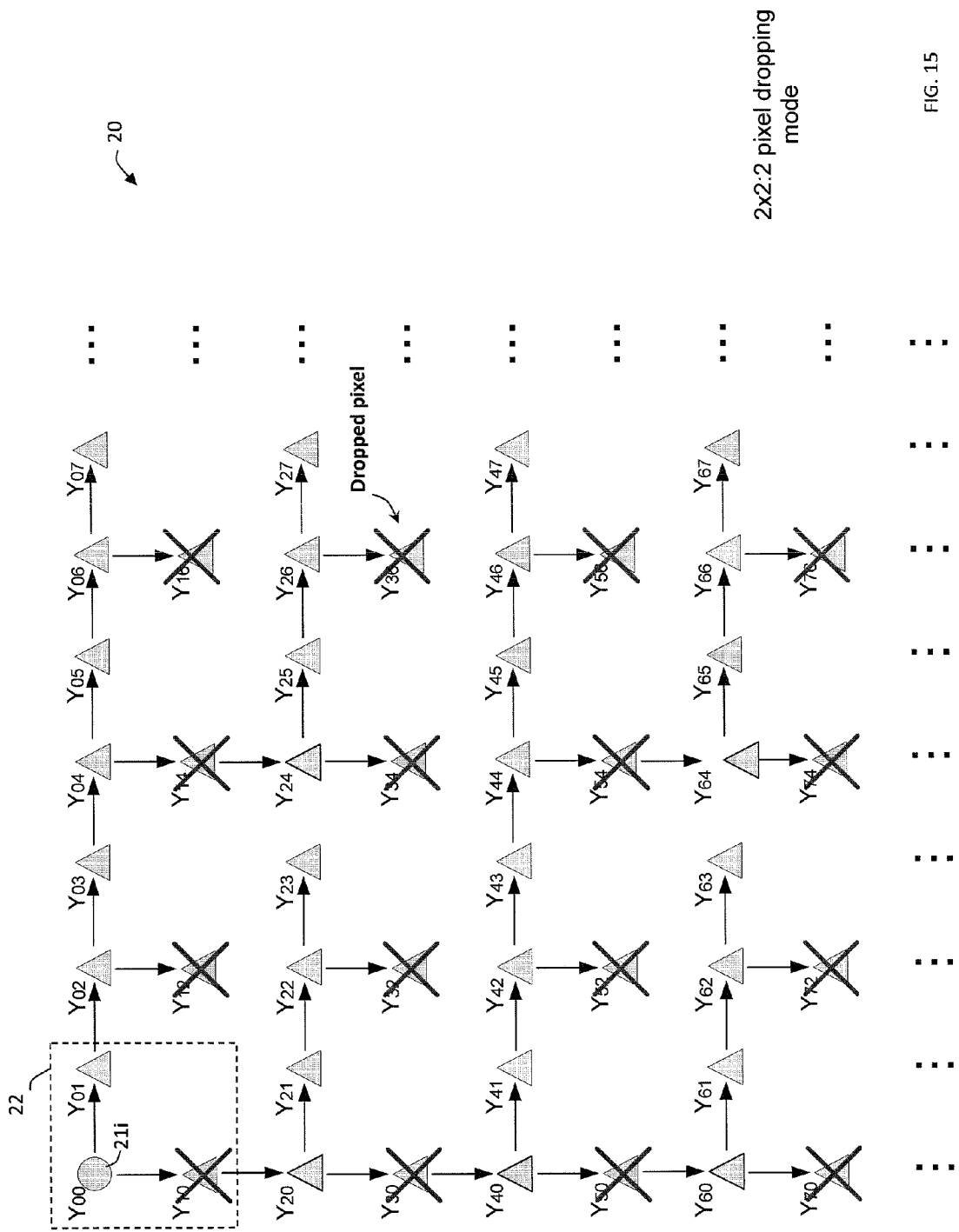
Figure 16:
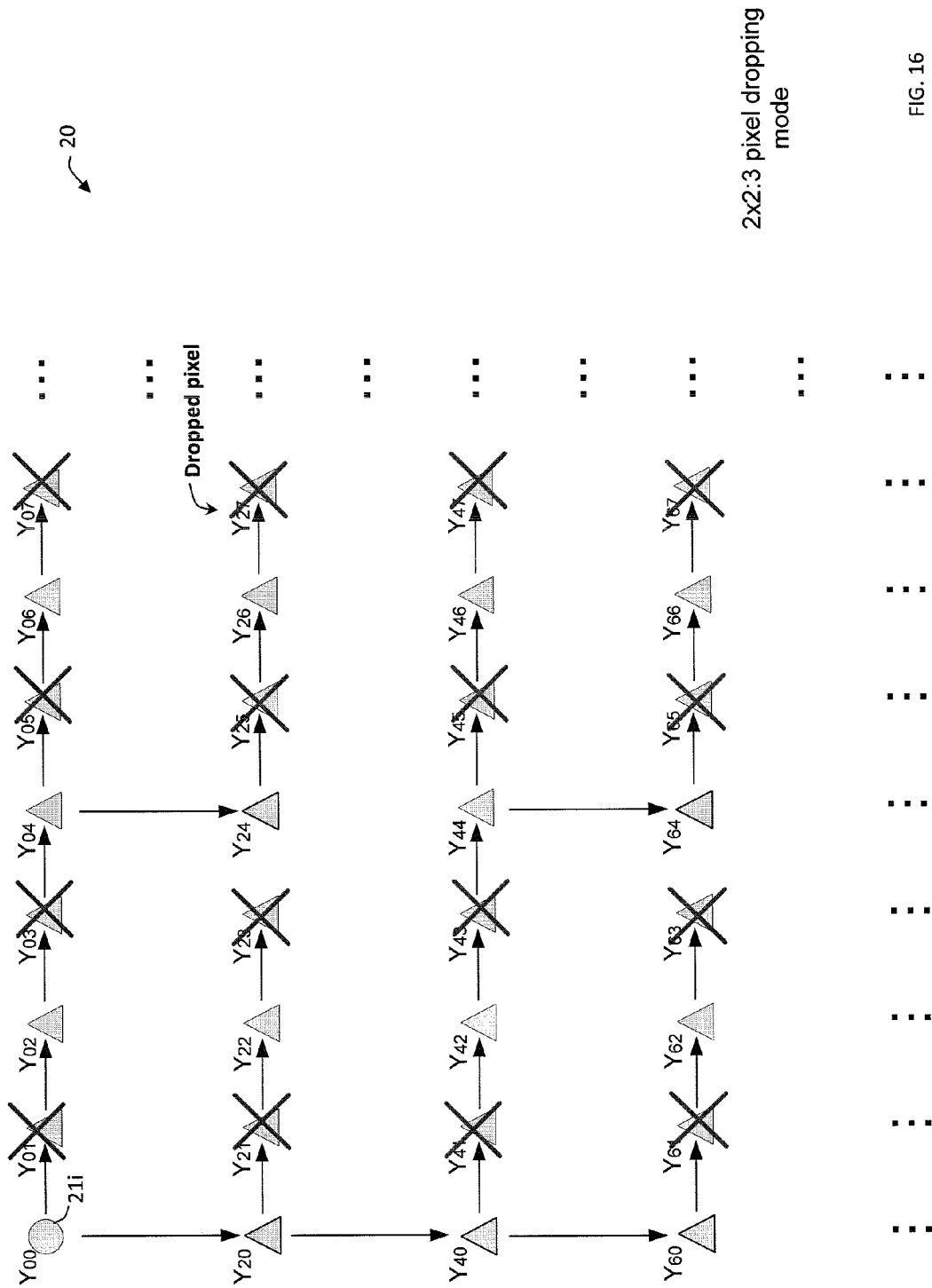
Figure 17:
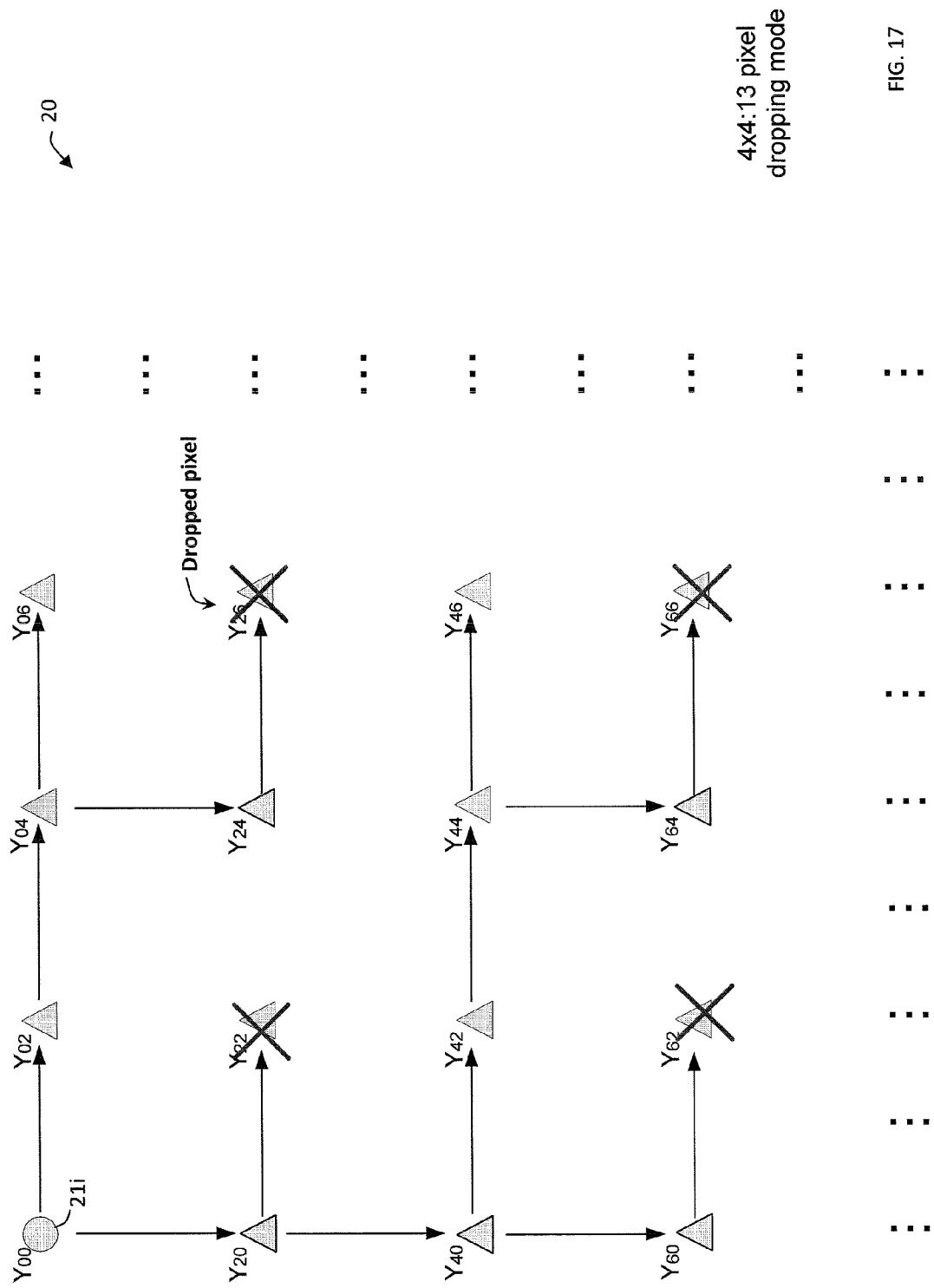
Figure 18:
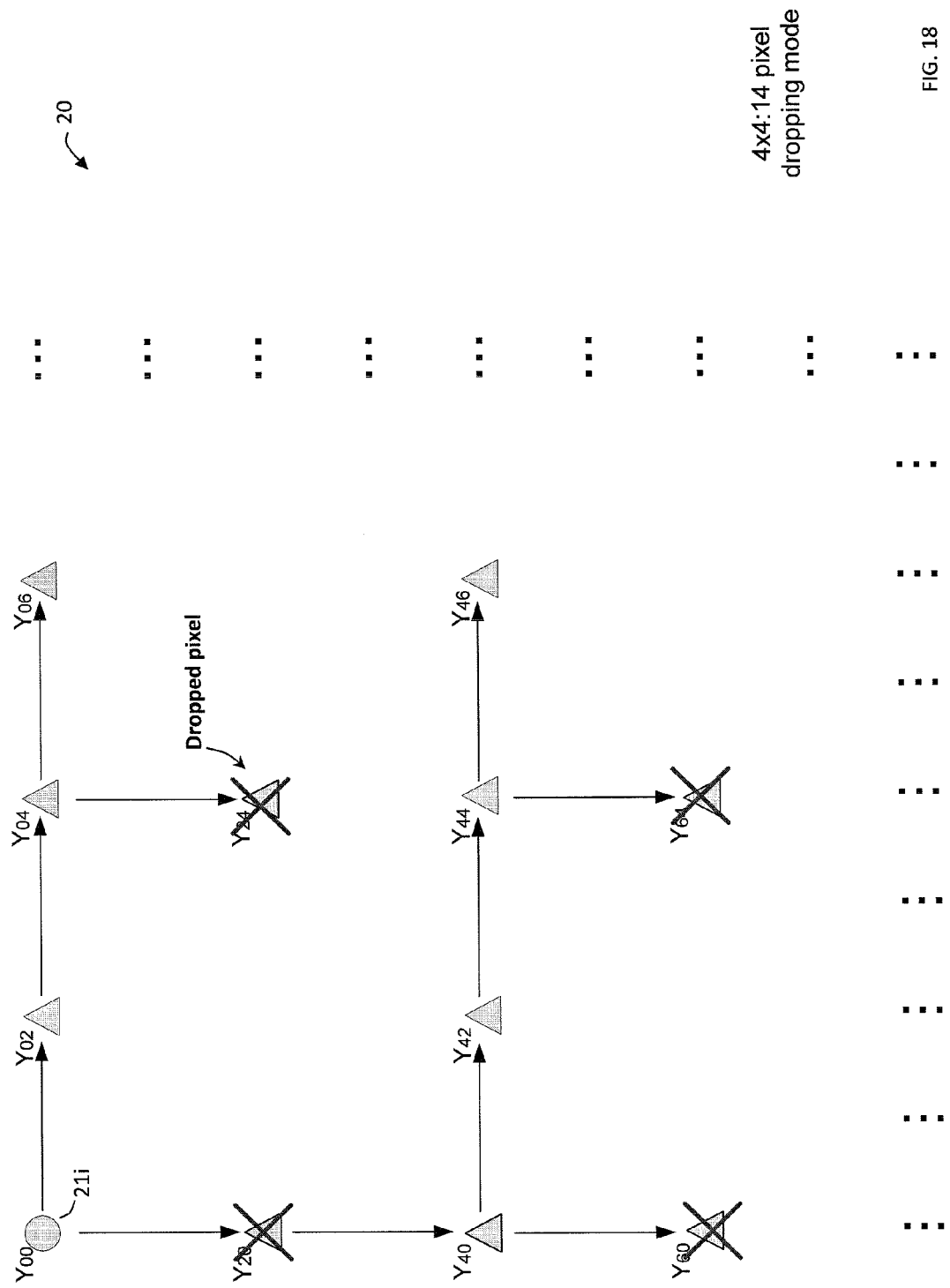
Figure 19:
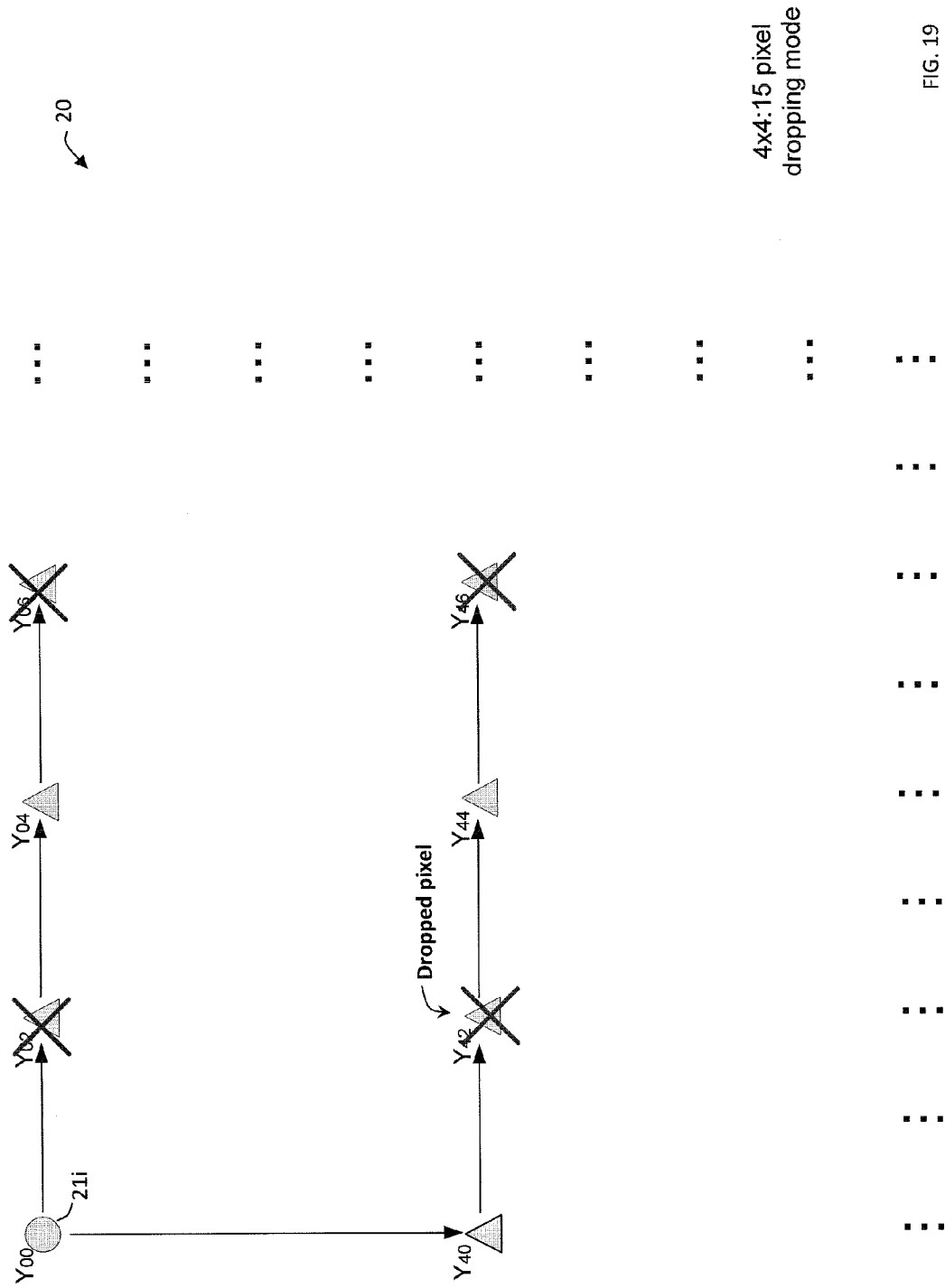
Figure 20:
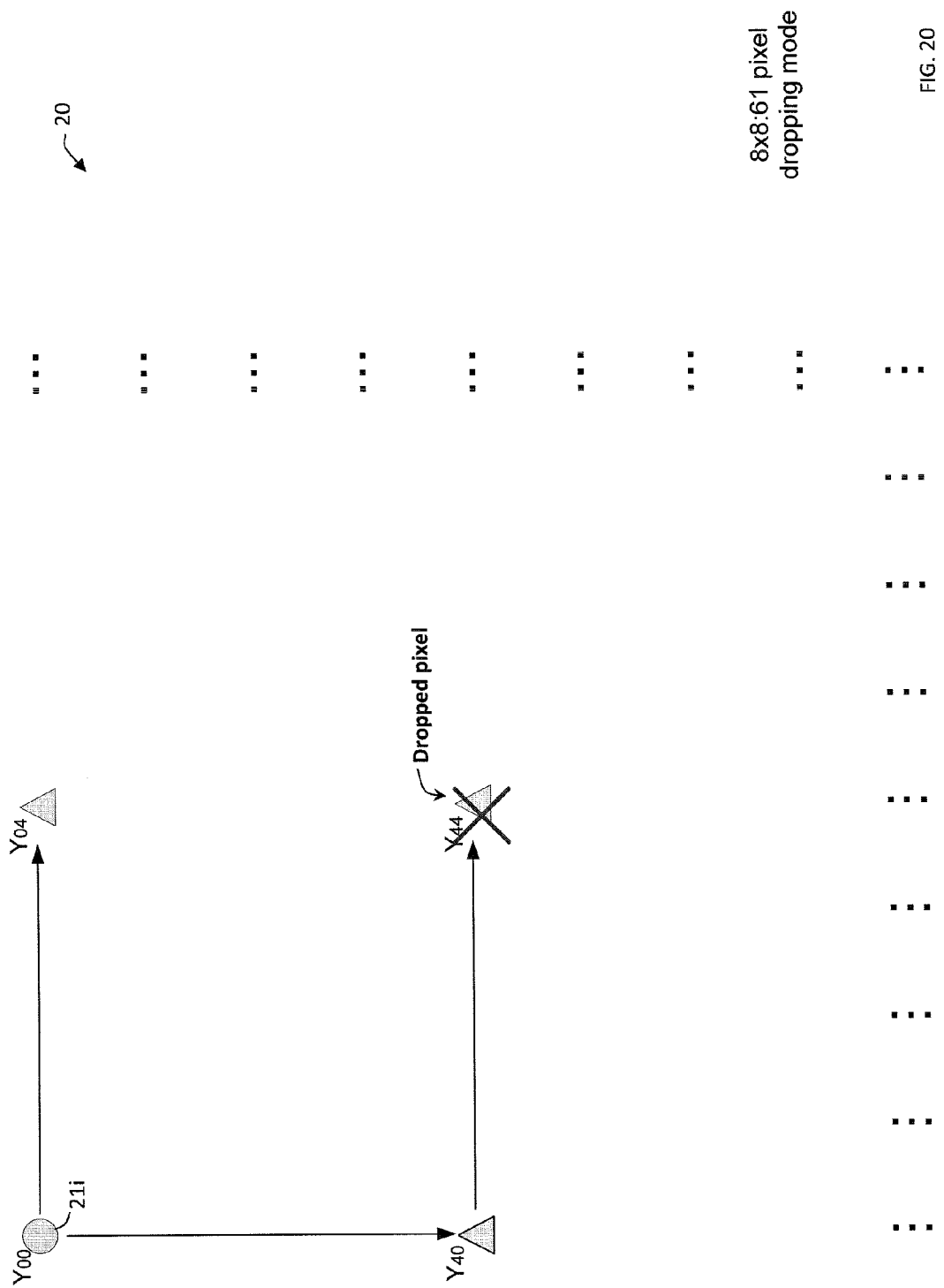
Figure 21:
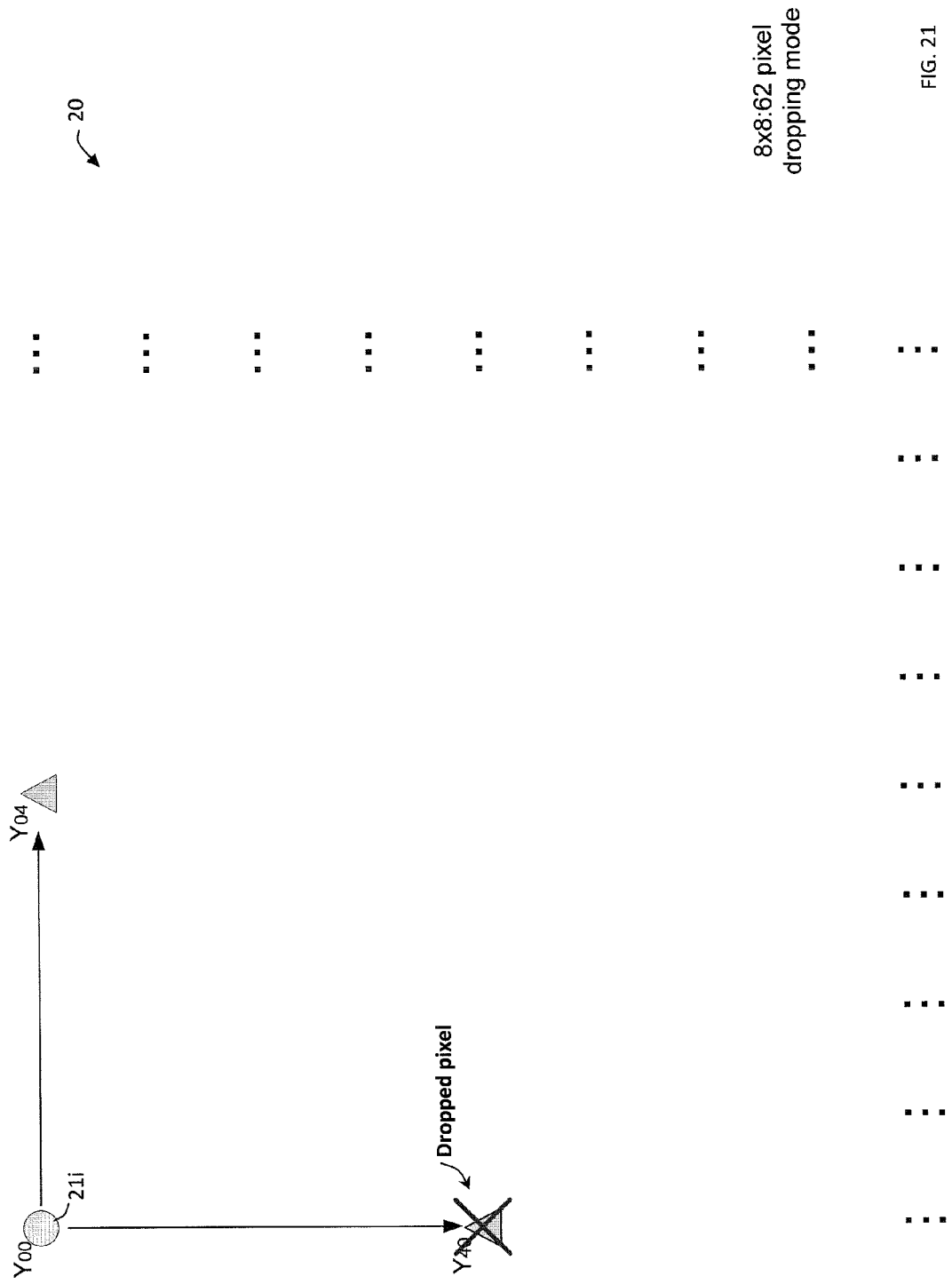
Figure 22:
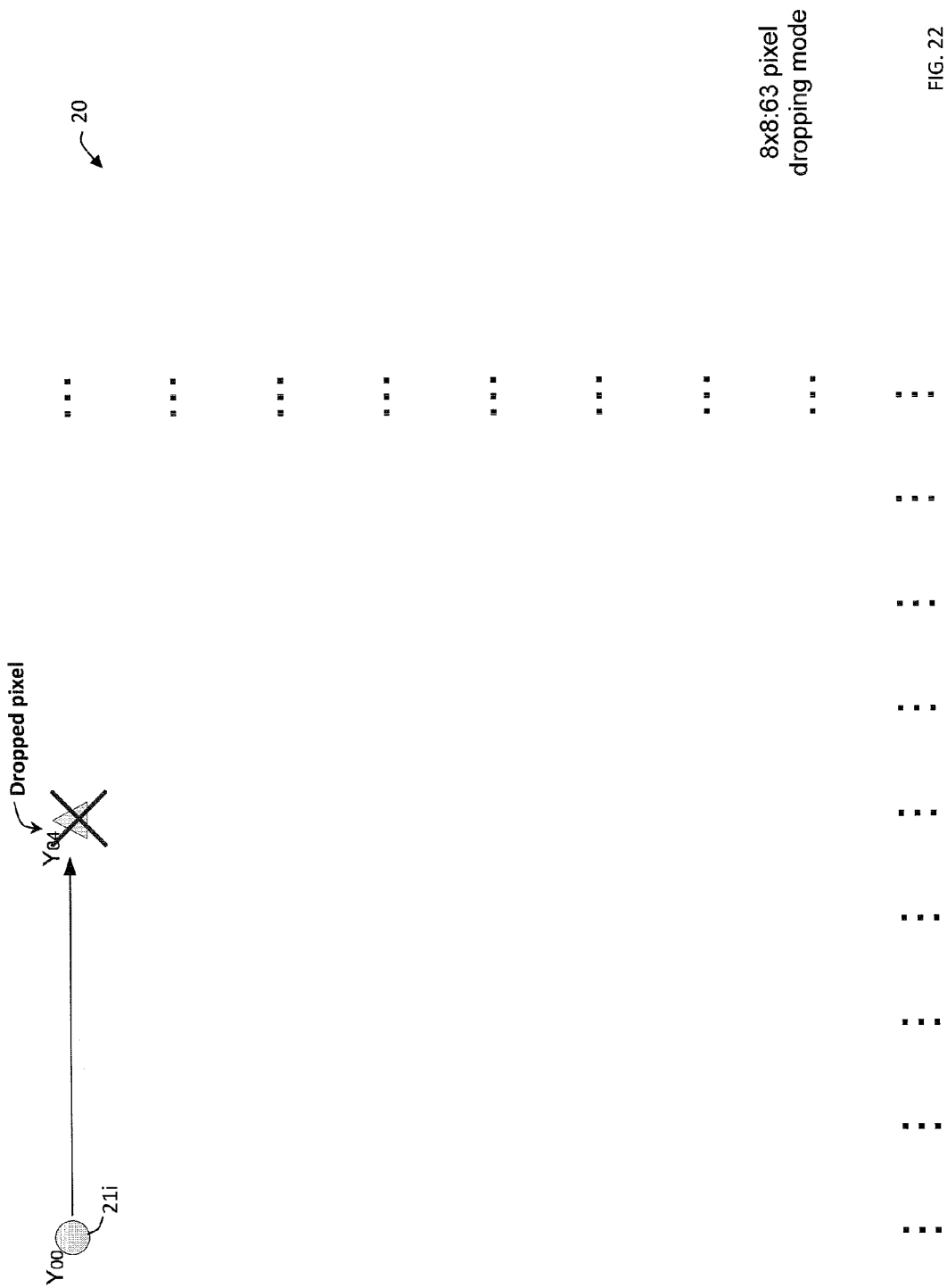

Other example pixel dropping modes are illustrated in FIGS. 12-22 according to embodiments of the invention, wherein dropped pixels are indicated by "X" markings across them. Specifically, FIG. 12 shows a 4×4:1 pixel dropping mode, FIG. 13 shows a 4×2:1 pixel dropping mode, FIG. 14 shows a 2×2:1 pixel dropping mode, FIG. 15 shows a 2×2:2 pixel dropping mode, FIG. 16 shows a 2×2:3 pixel dropping mode, FIG. 17 shows a 4×4:13 pixel dropping mode, FIG. 18 shows a 4×4:14 pixel dropping mode, FIG. 19 shows a 4×4:15 pixel dropping mode, FIG. 20 shows a 8×8:61 pixel dropping mode, FIG. 21 shows a 8×8:62 pixel dropping mode and FIG. 22 shows a 8×8:63 pixel dropping mode. Pixel dropping modes are in the order of increased number of dropped pixels. For example, 2×2:3 means dropping 48 pixels from the 64 pixels in a 8×8 pixel block, and 8×8:61 means pixel dropping mode 61 pixels from the 64 pixels, therefore, 2×2:3 dropping usually is done before 8×8:61 pixel dropping mode. Progressive pixel dropping may also be performed with the same pattern, such as 4×4:13 to 4×4:14 to 4×4:15 to 8×8:61 to 8×8:62 to 8×8:63.

FIGS. 10-22 show progressive application of successive pixel dropping modes 8×8:1, 8×4:1, 4×4:1, 4×2:1, 2×2:1, 2×2:2, 2×2:3, 4×4:13, 4×4:14, 4×4:15, 8×8:61, 8×8:62, 8×8:63, respectively, on a video frame 20 which has been previously processed according to pixel differential transformation application in FIGS. 4-9. For example, the output of 8×8 pixel differential transformation mode in FIG. 9 comprising a first pixel-reduced frame, is used as the input for 8×8:1 pixel dropping mode application in FIG. 10. The output of 8×8:1 pixel dropping mode application in FIG. 10 comprising a second pixel-reduced frame, is used as the input for 8×4:1 pixel dropping mode application in FIG. 11, and so on.

If a pixel to be dropped served as a reference pixel for other pixels to calculate difference values in the pixel differential transformation application, then re-calculation of difference values is performed during the dropping process. For example, in 2×2:2 pixel dropping mode (FIG. 15), when the pixel at coordinate (1, 0) with value $Y_{10}$ is dropped, the difference value $Y_{20}$ at coordinate (2, 0) is changed from $Y_{20}-Y_{10}$ to $Y_{20}-Y_{00}$, and the re-calculation is performed as $D=Y_{(10)}-Y_{00})+Y_{(20)}-Y_{10})=Y_{20}-Y_{00}$ for the pixel at location (2, 0), wherein D replaces the existing value $Y_{20}$ for the pixel at location (2, 0). Rate adaptation with pixel dropping may always be reversed if the wireless channel condition improves and higher data rate is available.

According to embodiments of the invention, for each of the pixel dropping modes, in each pixel block 22 the target pixels to be dropped are selected based on two criteria. First, the selected pixels are evenly distributed in a pixel block (and also video frame) to minimize visual quality degradation. Second, the pixels with maximum dependence length from an initial pixel 211 in a pixel block are selected to be dropped first.

Each mode of the progressive pixel dropping process provides a pixel-reduced frame which requires a lower transmission data rate than a prior pixel-reduced frame in the progression.

According to embodiments of the invention, a pixel dropping process may also be used with any pixel differential transformation mode performed in advance. For example, FIGS. 10-22 show different pixel dropping modes after 8×8 pixel differential transformation mode.

According to embodiments of the invention, a pixel dropping process may be applied without performing any pixel differential transformation mode in advance. In that case, the original pixel values in the frame 20 (FIG. 3) are dropped instead of difference values for pixels.

In one example, each original video frame comprises uncompressed video pixels corresponding to an image in a two dimensional in space. An example of a frame of uncompressed video pixel information comprises a 1080p video format, wherein each video frame includes 1080 rows and each row has 1920 pixels. Each pixel includes three color elements: Y, Cb, Cr or R, G, B. Each color element includes a fixed number of bits, for example, 8 bits or 10 bits or 12 bits.
Differentiation of Color Elements in Pixel Differential Transformation and Pixel Dropping Each pixel has three color elements (not shown). Color element partitioning in terms of RGB color space or YCbCr color space is performed before pixel partitioning (color element partitioning means to separate Y, Cb, Cr elements or R, G, B elements). Each color element has a corresponding bit plane. According to an embodiment of the invention, progressive rate adaptation includes application of differential transformation among the color elements, or among the bit planes.

According to embodiments of the invention, different pixel differential transformation and pixel dropping modes may be applied to different color elements of a pixel due to their different contributions to video quality. For example, for brightness (luma) Y, a 2×2 pixel differential transformation mode may be utilized, while for Cb (i.e., blue minus luma (B−Y)) and Cr (i.e., red minus luma (R−Y)) 4×4 pixel differential transformation modes may be utilized. In another example, pixel dropping is not utilized for Y, while 2×2:2 pixel dropping is utilized for Cb and Cr. In this case, video format is changed to 4:2:2 from 4:4:4. In another, example, pixel dropping is not used for Y while 2×2:3 pixel dropping is used for Cb and Cr. In this case, video format is changed to 4:2:0. Color depth dropping can also be different for different color elements. For example, Y can always keep more bit planes than Cb and Cr.

Examples of differentiation of color elements according to embodiments of the invention include:

Example 1

Y uses 2×2 pixel differential transformation, but Cb and Cr use 4×4 pixel differential transformation.

Example 2

4:4:4 to 4:2:2

Y uses no pixel dropping, but Cb and Cr use 2×2:2 pixel dropping.

Example 3

4:4:4 to 4:2:0

Y uses no pixel dropping, but Cb and Cr use 2×2:3 pixel dropping.

Example 4

Color Depth Reduction

Y can always keep more bit planes than Cb and Cr.
Different Order of Row and Column Processing In the examples above, for an image frame of pixels, row related processing is always performed first before column related processing. Embodiments of the invention are useful with different order combinations of row and column processing. In one example, pixel differential transformation progresses from mode 1×1 to mode 2×1 to mode 2×2 to mode 4×2, and so on. In another example, pixel differential transformation progresses from mode 1×1 to mode 1×2 to mode 2×2 to mode 2×4 and so on, wherein column related processing is always performed first before row related processing.

Figure 23:
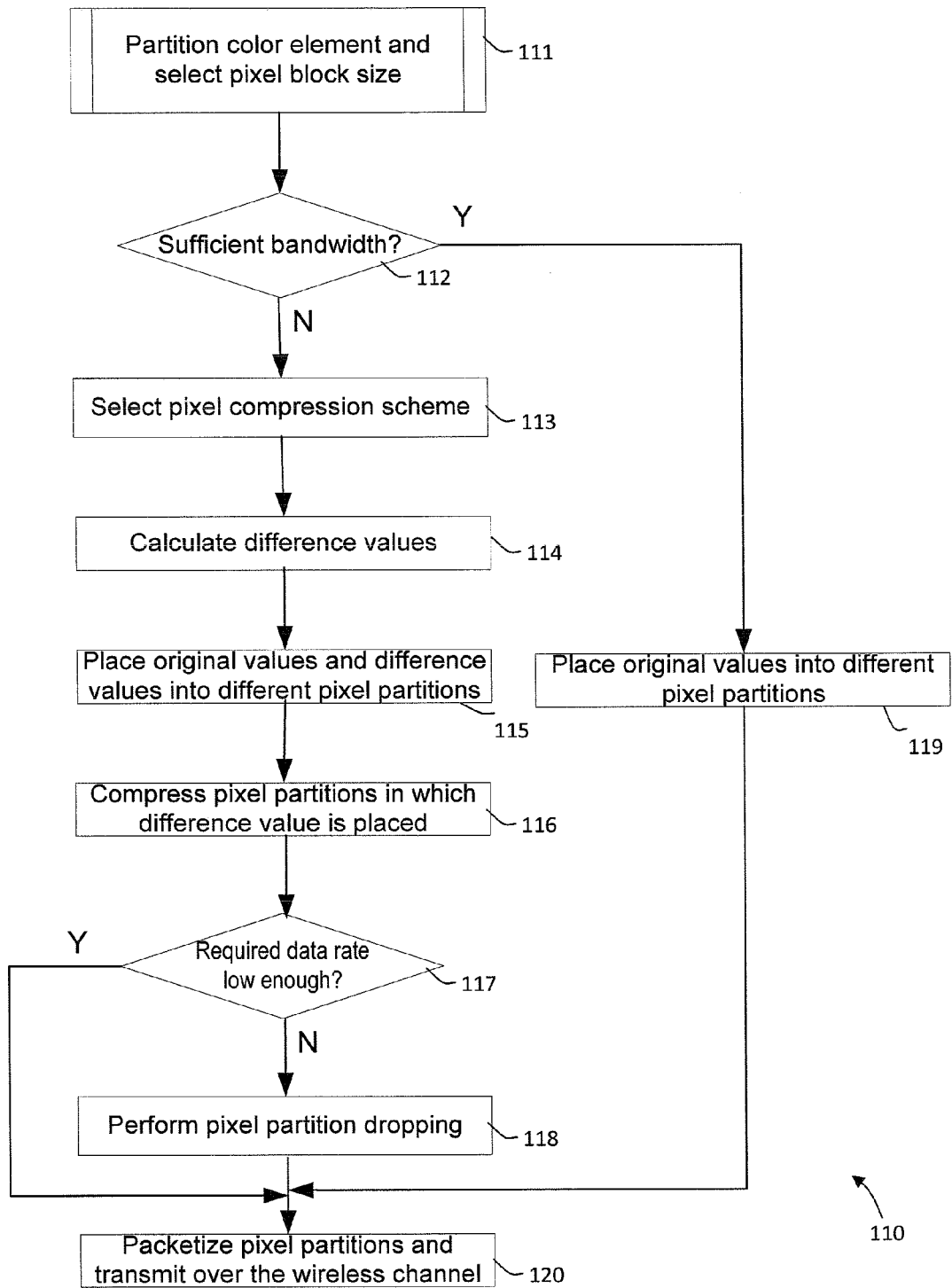
FIG. 23 shows a flowchart of a process for progressive rate adaptation in transmitting uncompressed video information from a sender device, according to an embodiment of the invention.

FIG. 23 shows a flowchart of a progressive rate adaptation process 110 at a sender device such as device 11 (FIG. 2), according to an embodiment of the invention, comprising:

Processing block 111: Partition pixel color elements and select pixel block size for a frame of uncompressed video information.

Processing block 112: Determine if sufficient wireless bandwidth is available to transmit the video frame? If no, proceed to block 113, else proceed to block 119.

Processing block 113: Select pixel compression scheme for performing progressive pixel differential transformation.

Processing block 114: Calculate difference values.

Processing block 115: Place original values and difference values into different pixel partitions.

Processing block 116: Compress pixel partitions in which difference values are placed by removing higher bit planes of difference values.

Processing block 117: Is the required data rate for wireless transmission of the processed pixel partitions sufficiently low for the available wireless bandwidth? If yes, proceed to block 120, else proceed to block 118.

Processing block 118: Perform progressive pixel dropping by pixel dropping. Proceed to block 120.

Processing block 119: Place original values into different pixel partitions. Proceed to block 120.

Processing block 120: Packetize pixel partitions and transmit over the wireless channel from the sender device to the receiver device.

In one embodiment of the invention, several process blocks of the process 110 (e.g., at least process blocks 113-115 and 118-119) is performed at the application and PAL layer 13 (or an Audio video control (AVC) layer) at the sender device 11. Certain operations such as packetization also involve the MAC layer 14M at the sender device 11.

Figure 24:
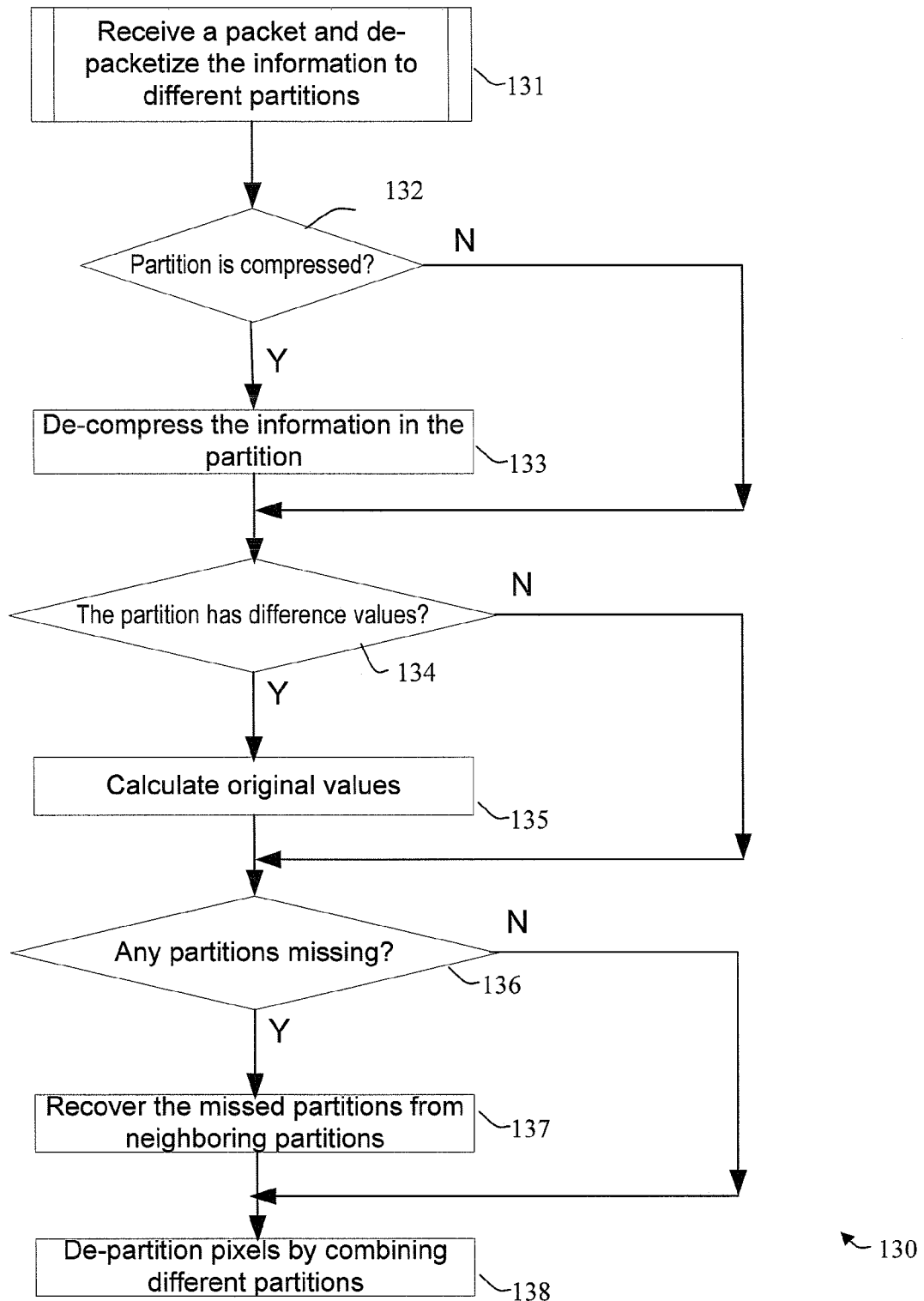
FIG. 24 shows a flowchart of a process for receiving and reconstructing uncompressed video information from received rate-reduced video information at a receiver device, according to an embodiment of the invention.

FIG. 24 shows a flowchart of a corresponding progressive rate adaptation process 130 at a receiver device, such as device 12 (FIG. 2), according to an embodiment of the invention, comprising:

Processing block 131: Receive a packet and separate different partitions. At the sender side, different partitions are placed into one packet. When the receiver receives the packets, the receiver identifies which part of the packet belongs to which partition.

Processing block 132: For each partition, if the information in the partition is compressed, then go to block 133. Otherwise, go to block 134.

Processing block 133: De-compress the information in a partition.

Processing block 134: If a partition carries the difference values of pixels, then go to block 135. Otherwise, go to block 136.

Processing block 135: Calculate the original pixel values for each partition which carries the difference values. This is opposite of progressive pixel differential transformation at the sender side. In one example, such a calculation is performed at the application layer module 16 of the receiver 12, and involves a regressive operation in reverse order of the progressive pixel differential transformation modes at the sender 11, by calculating the original pixel value from the difference values. For example, in FIGS. 4-9, the operation associated with each arrow between a reference pixel and a target pixel is reversed, wherein the differential value carried by the target pixel is replaced with the sum of the reference pixel value and the differential value (e.g., in FIGS. 4-9, the triangle symbols are replaced with circle symbols based on the calculation). The reversed operations for determining original pixel values begin in sequence from the last applied pixel differential transformation mode (e.g., FIG. 9) and continue in order in reverse direction to the first applied pixel differential transformation mode (e.g., FIG. 4). The reversed operations involve addition and subtraction operations to recover the original values of the pixels step by step. For example, from FIG. 9 to FIG. 8, the calculation is as follows: The pixel value at the position $Y_{(4i)(8j)}$ is changed to its original pixel value as:

$$Y_{(4i)(8j)} = (Y_{(4i)(8j)} - Y_{(4i-1)(8j)}) + (Y_{(4i-4)(8j)}) + (Y_{(4i-3)(8j)} - Y_{(4i-4)(8j)}) + (Y_{(4i-2)(8j)} - Y_{(4i-3)(8j)}) + (Y_{(4i-1)(8j)} - Y_{(4i-2)(8j)}).$$

Processing block 136: If any partition pixel is missing (e.g., dropped by the sender), then go to block 137. Otherwise, go to block 138.

Processing block 137: Recover missing partition pixels from neighboring partition pixels, such as by using average of pixel values of neighboring pixels. The recovery operation is also a regressive operation opposite of progressive pixel dropping at the sender side. This is similar in sequence to the regressive pixel differential transformation described in block 135 above, using values of the neighboring pixels to recover the dropped pixels such as by replacement with an adjacent pixel or replacement by average of adjacent pixels.

Processing block 138: De-partition pixels by combining pixels of different partitions to recover the original position order of the pixels in a picture of a video sequence, recovering uncompressed video.

In one embodiment of the invention, at least several process blocks of the process 130 (e.g., at least process blocks 135, 137) are performed by a reconstruction module at the Application and PAL layer 16 (or an AVC layer) at the receiver device 12. Certain operations such as de-packetization are performed by a de-packetization module of the MAC layer 15M at the receiver device 12.

Table 1 below illustrates examples of data rate ratio for each pixel differential transformation mode at different coding ratios of Huffman or Run-length coding, according to embodiments of the invention.

TABLE 1

Average data rate ratio after pixel differential transformation

| Pixel differential transformation mode | Average Coding Ratio | | | |
|---|---|---|---|---|
| | 0.6 | 0.5 | 0.3 | 0.2 |
| 2 × 1 | 0.8 | 0.75 | 0.65 | 0.6 |
| 2 × 2 | 0.7 | 0.63 | 0.48 | 0.4 |
| 4 × 2 | 0.65 | 0.56 | 0.39 | 0.3 |
| 4 × 4 | 0.63 | 0.53 | 0.34 | 0.25 |
| 8 × 4 | 0.61 | 0.52 | 0.32 | 0.23 |
| 8 × 8 | 0.61 | 0.51 | 0.31 | 0.21 |

Table 2 illustrates examples of data rate ratio for each pixel dropping mode after pixel differential transformation at different coding ratios of Huffman or Run-length coding, according to embodiments of the invention.

TABLE 2

Average data rate ratio after pixel differential transformation and pixel dropping

| Pixel differential transformation mode | Average Coding Ratio | | | | |
|---|---|---|---|---|---|
| | 1 | 0.6 | 0.5 | 0.3 | 0.2 |
| 8 × 8:1 | 0.98 | 0.59 | 0.5 | 0.31 | 0.21 |
| 8 × 4:1 | 0.97 | 0.59 | 0.5 | 0.31 | 0.22 |
| 4 × 4:1 | 0.94 | 0.59 | 0.5 | 0.33 | 0.24 |
| 4 × 2:1 | 0.88 | 0.58 | 0.5 | 0.35 | 0.28 |
| 2 × 2:1 | 0.75 | 0.55 | 0.5 | 0.4 | 0.35 |
| 2 × 2:2 | 0.5 | 0.4 | 0.38 | 0.33 | 0.3 |
| 2 × 2:3 | 0.25 | 0.25 | 0.25 | 0.25 | 0.25 |

TABLE 2-continued

Average data rate ratio after pixel differential transformation and pixel dropping

| Pixel differential transformation mode | Average Coding Ratio | | | | |
|---|---|---|---|---|---|
| | 1 | 0.6 | 0.5 | 0.3 | 0.2 |
| 4 × 4:13 | 0.19 | 0.14 | 0.13 | 0.1 | 0.088 |
| 4 × 4:14 | 0.13 | 0.1 | 0.094 | 0.081 | 0.075 |
| 4 × 4:15 | 0.063 | 0.063 | 0.063 | 0.063 | 0.063 |
| 8 × 8:61 | 0.047 | 0.034 | 0.031 | 0.025 | 0.022 |
| 8 × 8:62 | 0.031 | 0.025 | 0.023 | 0.02 | 0.019 |
| 8 × 8:63 | 0.016 | 0.016 | 0.016 | 0.016 | 0.016 |

Embodiments of the invention provide progressive rate adaptation for uncompressed video communication in wireless systems, utilizing simplified signal processing implementation, reduced computing overhead, reduced power consumption, reduced rate adaptation latency, reduced video quality loss or visual quality loss, and simple error recovery and frame reconstruction at the receiver.

Although the examples described herein refer to a frame of uncompressed video pixel information being subjected to progressive rate adaptation for transmission, the frame size (dimensions) can be selected based on available wireless channel bandwidth. Further, according to embodiments of the invention, the sender and/or receiver need not buffer an entire video frame, wherein portions of a video frame may be subjected to progressive rate adaptation and transmitted from the sender to the receiver.

As is known to those skilled in the art, the aforementioned example architectures described above, according to the present invention, can be implemented in many ways, such as program instructions for execution by a processor, as software modules, microcode, as computer program product on computer readable media, as logic circuits, as application specific integrated circuits, as firmware, as consumer electronic devices, etc., in wireless devices, in wireless transmitters/receivers, in wireless networks, etc. Further, embodiments of the invention can take the form of an entirely hardware embodiment, an entirely software embodiment or an embodiment containing both hardware and software elements.

The terms "computer program medium," "computer usable medium," "computer readable medium", and "computer program product," are used to generally refer to media such as main memory, secondary memory, removable storage drive, a hard disk installed in hard disk drive, and signals. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Furthermore, the computer readable medium may comprise computer readable information in a transitory state medium such as a network link and/or a network interface, including a wired network or a wireless network, that allow a computer to read such computer readable information. Computer programs (also called computer control logic) are stored in main memory and/or secondary memory. Computer programs may also be received via a communications interface. Such computer programs, when executed, enable the computer system to perform the features of the present invention as discussed herein. In particular, the computer programs, when executed, enable the processor multi-core processor to perform the features of the computer system. Accordingly, such computer programs represent controllers of the computer system.

Though the present invention has been described with reference to certain versions thereof; however, other versions are possible. Therefore, the spirit and scope of the appended claims should not be limited to the description of the preferred versions contained herein.

What is claimed is:

1. A method of transmitting video information over a wireless communication medium, comprising:
   in a wireless sender device, obtaining original pixel information of uncompressed video pixels;
   performing successive progressive transmission data rate adaptation operations on selected pixels utilizing pixel differential transformation to obtain rate-reduced pixel information based on performing a pixel differential transformation mode on pixels of selected pairs of reference pixels and target pixels in a block of selected pixels, wherein the pixel differential transformation mode comprises performing a pixel differential operation based on determining pixel differential information between current pixel information of a reference pixel and current pixel information of a target pixel and replacing the current pixel information of the target pixel with the pixel differential information as the rate-reduced pixel information, each determined pixel differential information is used in a successive progression for a further pixel differential operation where the target pixel is used as a next reference pixel for a next pixel differential operation, and the rate-reduced pixel information requires a lower transmission data rate than the original pixel information; and
   transmitting the rate-reduced pixel information over the wireless communication medium.

2. The method of claim 1, wherein:
   performing successive progressive transmission data rate adaptation operations comprises performing iterative pixel differential operations to determine target pixel difference values; and
   previously determined difference values in one pixel differential transformation mode are used to determine further difference values in a next pixel differential transformation mode.

3. The method of claim 2, wherein:
   performing successive progressive transmission data rate adaptation operations further comprises performing successive pixel differential transformation modes, such that each pixel differential transformation mode further reduces transmission data rate of selected pixel information as compared to a previous pixel differential transformation mode.

4. The method of claim 1, wherein:
   the wireless sender device transmits the rate-reduced pixel information instead of the original pixel information.

5. The method of claim 4, wherein:
   a block size is selected based on the differential transformation mode; and
   each target pixel position is selected to reduce the overall average dependence length from an initial pixel to the target pixels in the block of selected pixels.

6. The method of claim 5, wherein:
each target pixel position is selected to reduce maximum dependence length from the initial pixel to the target pixels.

7. The method of claim 6, wherein:
the pixels in each block are positioned in rows and columns;
a first pixel differential transformation mode comprises performing row-wise pixel differential operations on selected pixel pairs positioned in rows; and
a subsequent pixel differential transformation mode comprises performing column-wise pixel differential operations on selected pixel pairs positioned in columns.

8. The method of claim 7, further comprising:
partitioning spatially correlated pixels in each block into different partitions;
compressing the pixel differential information in each partition to compress the pixel information in each partition;
placing pixel information from partitions into packets; and
transmitting each packet over the wireless communication medium.

9. The method of claim 4, wherein:
performing successive progressive transmission data rate adaptation operations further comprises performing successive pixel dropping modes after performing one or more pixel differential transformation modes, such that each pixel dropping mode further reduces transmission data rate of the pixel information by discarding pixels in the block of selected pixels.

10. The method of claim 9, wherein:
performing each pixel dropping mode comprises performing a pixel discarding operation,
selected pixels at different locations in a block are evenly discarded, and
the pixels with maximum dependence length from an initial pixel in the block are discarded first.

11. The method of claim 4, wherein the pixel information comprises color element information.

12. The method of claim 8, further comprising:
at a wireless receiver device, receiving the rate-reduced pixel information;
determining original pixel values from the rate-reduced pixel information by regressive data rate adaptation in reverse order of the successive progressive transmission data rate adaptation at the sender device; and
reconstructing the uncompressed video pixel information from the spatially correlated pixels.

13. The method of claim 12, further comprising:
identifying a corrupt pixel by checking if received pixel information for a pixel is missing; and
recovering missing pixel information using received pixel information of pixels that are spatially correlated with the corrupt pixel.

14. The method of claim 2, wherein:
performing successive progressive transmission data rate adaptation operations comprises performing successive pixel dropping modes, such that each pixel dropping mode further reduces transmission data rate of the pixel information.

15. The method of claim 14, wherein:
performing each pixel dropping mode comprises performing a pixel discarding operation, and selected pixels at different locations in a block are evenly discarded.

16. The method of claim 15, wherein performing each pixel discarding operation comprises:
discarding a selected pixel in a rectangular block of pixels, wherein the block size is selected based on the pixel dropping mode, such that a pixel is selected to be discarded based on distance of the pixel to a reference pixel in the block.

17. The method of claim 16, wherein the selected pixel to be discarded has the longest distance from an initial pixel in the block, such that the pixels with maximum dependence length from an initial pixel in the block are discarded first.

18. A wireless station for transmitting video information over a wireless communication medium, comprising:
a rate adaptation interface configured to perform successive progressive transmission data rate adaptation operations on selected pixels of original pixel information for uncompressed video pixels utilizing pixel differential transformation to generate rate-reduced pixel information based on a pixel differential transformation mode performed on pixel information of selected pairs of reference and target pixels in a block of selected pixels, wherein the pixel differential transformation mode determines pixel differential information between current pixel information of a reference pixel and current pixel information of a target pixel and replaces the current pixel information of the target pixel with the pixel differential information as the rate-reduced pixel information, each successive determination of pixel differential information is used for a further pixel differential operation where the target pixel is used as a next reference pixel for a next pixel differential operation, and the rate-reduced pixel information requires a lower transmission data rate than the original pixel information; and
a communication interface configured to transmit the rate-reduced pixel information over the wireless communication medium.

19. The wireless station of claim 18, wherein:
the rate adaptation interface is configured to performing successive progressive data rate adaptation operations on pixel information of selected pixels comprising iterative pixel differential operations to determine target pixel difference values, and to determine further difference values in a next pixel differential transformation mode using previously determined difference values in one pixel differential transformation mode; and
each successive data rate adaptation operation further reduces transmission data rate of said pixel information, for adaptation to available bandwidth of the wireless communication medium.

20. The wireless station of claim 19, wherein the rate adaptation interface is configured to perform successive progressive pixel differential transformation modes, such that each pixel differential transformation mode further reduces transmission data rate of the selected pixel information.

21. The wireless station of claim 18, wherein:
the communication interface is configured to transmit the rate-reduced pixel information instead of the original pixel information.

22. The wireless station of claim 21, wherein:
the block size is selected based on the differential transformation mode; and
each target pixel position is selected to reduce the overall average dependence length from an initial pixel to the target pixels in the block of selected pixels.

23. The wireless station of claim 22, wherein:
each target pixel position is selected to reduce maximum dependence length from the initial pixel to the target pixels.

24. The wireless station of claim 23, wherein:
the pixels in each block are positioned in rows and columns; and
the rate adaptation interface is further configured to perform a first pixel differential transformation mode by row-wise pixel differential operations on selected pixel pairs positioned in rows, and to perform a subsequent pixel differential transformation mode to perform column-wise pixel differential operations on selected pixel pairs positioned in columns.

25. The wireless station of claim 24, further comprising:
a processor configured to partitioning spatially correlated pixels in each block into different partitions, to compress the pixel differential information in each partition to compress the pixel differential information in each partition, and to place pixel information from partitions into packet, wherein the communication interface is configured to transmit each packet over the wireless communication medium.

26. The wireless station of claim 21, wherein the rate adaptation interface is configured to perform successive pixel dropping modes after one or more pixel differential transformation modes is performed, such that each pixel dropping mode further reduces transmission data rate of the pixel information by discarding pixels in the block of selected pixels.

27. The wireless station of claim 26, wherein the rate adaptation interface is configured to perform each pixel dropping mode based on a pixel discarding operation, selected pixels at different locations in a block are evenly discarded, and the pixels with maximum dependence length from an initial pixel in the block are discarded first.

28. The wireless station of claim 21, wherein the pixel information comprises color element information.

29. The wireless station of claim 19, wherein the rate adaptation interface is configured to perform successive pixel dropping modes, such that each pixel dropping mode further reduces transmission data rate of the pixel information.

30. The wireless station of claim 29, wherein the rate adaptation interface is configured to perform each pixel dropping mode based on a pixel discarding operation, and selected pixels at different locations in a block are evenly discarded.

31. The wireless station of claim 30, wherein the rate adaptation interface is configured to perform each pixel discarding operation by discarding a selected pixel in a rectangular block of pixels, and the block size is selected based on the pixel dropping mode, such that pixels with maximum dependence length from an initial pixel in the block are discarded first.

32. A wireless communication system, comprising:
a transmitting wireless station and a receiving wireless station;
the transmitting wireless station configured to transmit video information over a wireless communication medium, the transmitting wireless station comprising:
a rate adaptation interface configured to perform successive progressive transmission data rate adaptation operations on pixel information of selected pixels of original uncompressed video pixels utilizing pixel differential transformation to generate rate-reduced pixel information to perform a pixel differential transformation mode on pixel information of selected pairs of reference and target pixels in a block of selected pixels, wherein each successive progressive transmission data rate adaptation operation further reduces transmission data rate of said pixel information, and to perform the pixel differential transformation mode to determine a pixel differential value between current pixel information of a reference pixel and current pixel information of a target pixel and to replace the current pixel information of the target pixel with the pixel differential value as the rate-reduced pixel information, each determined pixel differential value is used in a successive progression for a further pixel differential operation where the target pixel is used as a next reference pixel for a next pixel differential operation, and the rate-reduced pixel information requires a lower transmission data rate than original uncompressed video pixel information; and
a communication interface configured to transmit the rate-reduced pixel information over the wireless communication medium to the receiving wireless station; and
the receiving wireless station comprising:
a communication interface configured to perform wireless communication over the wireless communication medium; and
a recovery interface configured to recover the original uncompressed video pixel information from the rate-reduced pixel information.

33. The system of claim 32, wherein:
the rate adaptation interface is configured to:
perform iterative pixel differential operations to determine target pixel difference values; and
determine further difference values in a next pixel differential transformation mode using previously determined difference values in one pixel differential transformation mode; and
the wireless communication interface of the transmitting wireless station is configured to transmit the rate-reduced pixel information instead of the original uncompressed video pixel information.

34. The system of claim 33, wherein:
the block size is selected based on the differential transformation mode;
each target pixel position is selected to reduce the overall average dependence length from an initial pixel to the target pixels;
each target pixel position is selected to reduce maximum dependence length from the initial pixel to the target pixels; and
the pixels in each block are positioned in rows and columns, and the rate adaptation interface is further configured to perform a first pixel differential transformation mode by row-wise pixel differential operations on selected pixel pairs positioned in rows, and to perform column-wise pixel differential operations on selected pixel pairs positioned in columns.

35. The system of claim 34, wherein the transmitting wireless station further comprises a processor configured to partition spatially correlated pixels in each block into different partitions, to compress the pixel differential information in each partition, and to place pixel information from partitions into packet to transmit over the wireless communication medium.

36. The system of claim 33, wherein the rate adaptation interface is configured to perform successive pixel dropping modes after one or more pixel differential transformation modes, such that each pixel dropping mode further reduces transmission data rate of the pixel information by discarding pixels in the block of selected pixels.

37. The system of claim 36, wherein the rate adaptation interface is configured to perform each pixel dropping mode by pixel discarding operation, selected pixels at different locations in a block are evenly discarded, and the pixels with maximum dependence length from an initial pixel in the block are discarded first.

38. The system of claim 32, wherein the rate adaptation interface is configured to perform successive pixel dropping modes, such that each pixel dropping mode further reduces transmission data rate of the pixel information.

39. The system of claim 38, wherein the rate adaptation interface is configured to perform each pixel dropping mode by performing a pixel discarding operation, and selected pixels at different locations in a block are evenly discarded.

40. The system of claim 39, wherein the rate adaptation interface is configured to perform each pixel discarding operation by discarding a selected pixel in a rectangular block of pixels, and the block size is selected based on the pixel dropping mode, such that a pixel is selected to be discarded based on distance of the pixel to a reference pixel in the block.

41. The system of claim 40, wherein the rate adaptation interface is configured to discard pixels with maximum dependence length from an initial pixel in the block are discarded first.

42. The method of claim 1, wherein the block of selected pixels comprises an initial pixel and proximate spatially correlated pixels.

43. The method of claim 42, wherein positions of the selected pixels are evenly distributed in each block to minimize visual quality degradation.

44. The wireless station of claim 18, wherein the block of selected pixels comprises an initial pixel and proximate spatially correlated pixels.

45. The wireless station of claim 44, wherein positions of the selected pixel are evenly distributed in each block to minimize visual quality degradation.

46. The system of claim 32, wherein the block of selected pixels comprises an initial pixel and proximate spatially correlated pixels.

47. The system of claim 46, wherein positions of the selected pixel are evenly distributed in each block to minimize visual quality degradation.

* * * * *